United States Patent
Berman et al.

(10) Patent No.: US 12,224,769 B2
(45) Date of Patent: Feb. 11, 2025

(54) FAST POLYNOMIAL DIVISION BY MONOMIAL FOR REED-SOLOMON ELP MAINTENANCE

(71) Applicant: SAMSUNG ELECTRONICS CO., LTD., Suwon-si (KR)

(72) Inventors: Amit Berman, Tel-Aviv (IL); Dikla Shapiro, Tel-Aviv (IL); Yaron Shany, Tel-Aviv (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/196,581

(22) Filed: May 12, 2023

(65) Prior Publication Data

US 2024/0380416 A1 Nov. 14, 2024

(51) Int. Cl.
*H03M 13/15* (2006.01)
*H03M 13/00* (2006.01)

(52) U.S. Cl.
CPC ..... *H03M 13/1515* (2013.01); *H03M 13/611* (2013.01)

(58) Field of Classification Search
CPC .......... H03M 13/1515; H03M 13/611
See application file for complete search history.

(56) References Cited

U.S. PATENT DOCUMENTS 11,855,658 B1 * 12/2023 Berman ............ H03M 13/3746

* cited by examiner

*Primary Examiner* — Thien Nguyen
(74) *Attorney, Agent, or Firm* — Sughrue Mion, PLLC

(57) ABSTRACT

Systems, devices, and methods for decoding information bits obtained from storage, including obtaining a codeword from among a plurality of codewords stored in a storage device, wherein the codeword includes a plurality of frames; obtaining an initial error locator polynomial (ELP) corresponding to the codeword; decoding a frame of the plurality of frames; based on determining that the frame is successfully decoded, determine an updated ELP based on the initial ELP and information about the frame; and obtaining information bits corresponding to the codeword based on the updated ELP, wherein the updated ELP includes a plurality of updated coefficients, and wherein the updated ELP is determined by simultaneously calculating at least two updated coefficients from among the plurality of updated coefficients.

20 Claims, 14 Drawing Sheets

FAST POLYNOMIAL DIVISION BY MONOMIAL FOR REED-SOLOMON ELP MAINTENANCE

BACKGROUND

1. Field

Apparatuses and methods consistent with embodiments relate to a process for performing error correction coding, more particularly maintaining an error locator polynomial throughout a decoding process.

2. Description of Related Art

Data storage components may use error correction codes (ECC) to correct data corruption which may occur in a memory. Some types of ECC coding, for example ECC coding using an SPolar generalized concatenated code (GCC) coding scheme, may use Reed Solomon (RS) decoding as part of a decoding flow. In RS decoding, an error locator polynomial (ELP) may be used to determine error locations in a codeword. The ELP may be a polynomial in which coefficients equal to zero may indicate the location of an erroneous symbol, for which RS decoding has failed.

In the initial stage of RS decoding, the roots of the ELP may indicate all of the known failing symbols, which may also be referred to as erasures. The initial value of the ELP may be built from the known error locations.

In a GCC coding scheme, a symbol may be referred to as a frame j. For example, for each frame j for which RS decoding fails, the ELP may be multiplied by a monomial $(1-\alpha^j x)$. After the ELP is constructed in this way, a zero in $\alpha^j$ may indicate an error in the frame j.

A GCC decoding flow may include performing several iterations of RS decoding for each GCC codeword. As a result, recalculating the ELP after every decoded frame, or every decoded chunk of frames, may be very resource intensive. Therefore, it may be beneficial to calculate an initial ELP in very early stages, considering all of the to-be-decoded frames as erasures, and then maintain the ELP throughout the decoding process by updating the ELP after each frame is successfully decoded.

SUMMARY

According to an aspect of one or more embodiments, a storage system includes a storage device configured to store a plurality of codewords; and at least one processor configured to: obtain a codeword from among the plurality of codewords from the storage device, wherein the codeword includes a plurality of frames; obtain an initial error locator polynomial (ELP) corresponding to the codeword; decode a frame of the plurality of frames; based on determining that the frame is successfully decoded, determine an updated ELP based on the initial ELP and information about the frame; and obtain information bits corresponding to the codeword based on the updated ELP, wherein the updated ELP includes a plurality of updated coefficients, wherein the at least one processor is further configured to determine the updated ELP by simultaneously calculating at least two updated coefficients from among the plurality of updated coefficients.

According to an aspect of one or more embodiments, a device for decoding a codeword which includes a plurality of frames includes at least one processor configured to: obtain an initial error locator polynomial (ELP) corresponding to the codeword; decode a frame of the plurality of frames; based on determining that the frame is successfully decoded, determine an updated ELP by simultaneously calculating at least two updated coefficients from among a plurality of updated coefficients included in the updated ELP; and obtain information bits corresponding to the codeword based on the updated ELP.

According to an aspect of one or more embodiments, a method of controlling a storage system is executed by at least one processor and includes: obtaining a codeword from a storage device, wherein the codeword includes a plurality of frames; obtaining an initial error locator polynomial (ELP) corresponding to the codeword; decoding a frame of the plurality of frames; based on determining that the frame is successfully decoded, determining an updated ELP based on the initial ELP and information about the frame; and obtaining information bits corresponding to the codeword based on the updated ELP, wherein the updated ELP includes a plurality of updated coefficients, and wherein the updated ELP is determined by simultaneously calculating at least two updated coefficients from among the plurality of updated coefficients.

According to an aspect of one or more embodiments, a method for decoding a codeword is executed by at least one processor and includes: obtaining an initial error locator polynomial (ELP) corresponding to the codeword, wherein the codeword includes a plurality of frames; decoding a frame of the plurality of frames; based on determining that the frame is successfully decoded, determining an updated ELP by simultaneously calculating at least two updated coefficients from among a plurality of updated coefficients included in the updated ELP; and obtaining information bits corresponding to the codeword based on the updated ELP.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

As discussed above, some types of error correction code (ECC) coding schemes, for example ECC coding using an SPolar generalized concatenated code (GCC) coding scheme, may use Reed Solomon (RS) decoding as part of a decoding flow. For example, in a GCC coding scheme, a GCC codeword may include j frames, which may be decoded using RS decoding. An error locator polynomial (ELP) for determining error locations in a codeword may be constructed by multiplying all monomials $(1-\alpha^j x)$ for j=0, ..., (N−1). An initial degree of the ELP may be N, and the number of coefficients of the ELP may be derived from N.

In embodiments, constructing the ELP in this manner may be very inefficient. For example, in an SPolar GCC decoding flow, each GCC codeword may require multiple iterations of RS decoding. Therefore, if the ELP must be recalculated before every RS decoding iteration, many redundant multiplication operations may be performed, and significant latency may be added to RS decoding operations.

Accordingly, embodiments may provide a method of generating an ELP by obtaining an initial ELP which includes all possible error locations, which also may be referred to as deletions. For example, in a GCC codeword in which a plurality of frames have not yet been decoded, an initial ELP may indicate that all of the plurality frames are error locations. Then after each frame is successfully decoded, the initial ELP may be divided by a monomial corresponding to the decoded frame. The ELP may be maintained in this way throughout the GCC decoding process, which may allow increased decoding efficiency by eliminating the need to calculate the ELP before each RS decode. In addition, embodiments may provide a method of accelerating this division calculation, by calculating multiple coefficients of the ELP simultaneously. For example, embodiments may provide a method of calculating a highest-order coefficient of the ELP while simultaneously calculating a lowest-order coefficient of the ELP, and then proceeding sequentially from both ends of the ELP until all coefficients have been calculated.

Figure 1:
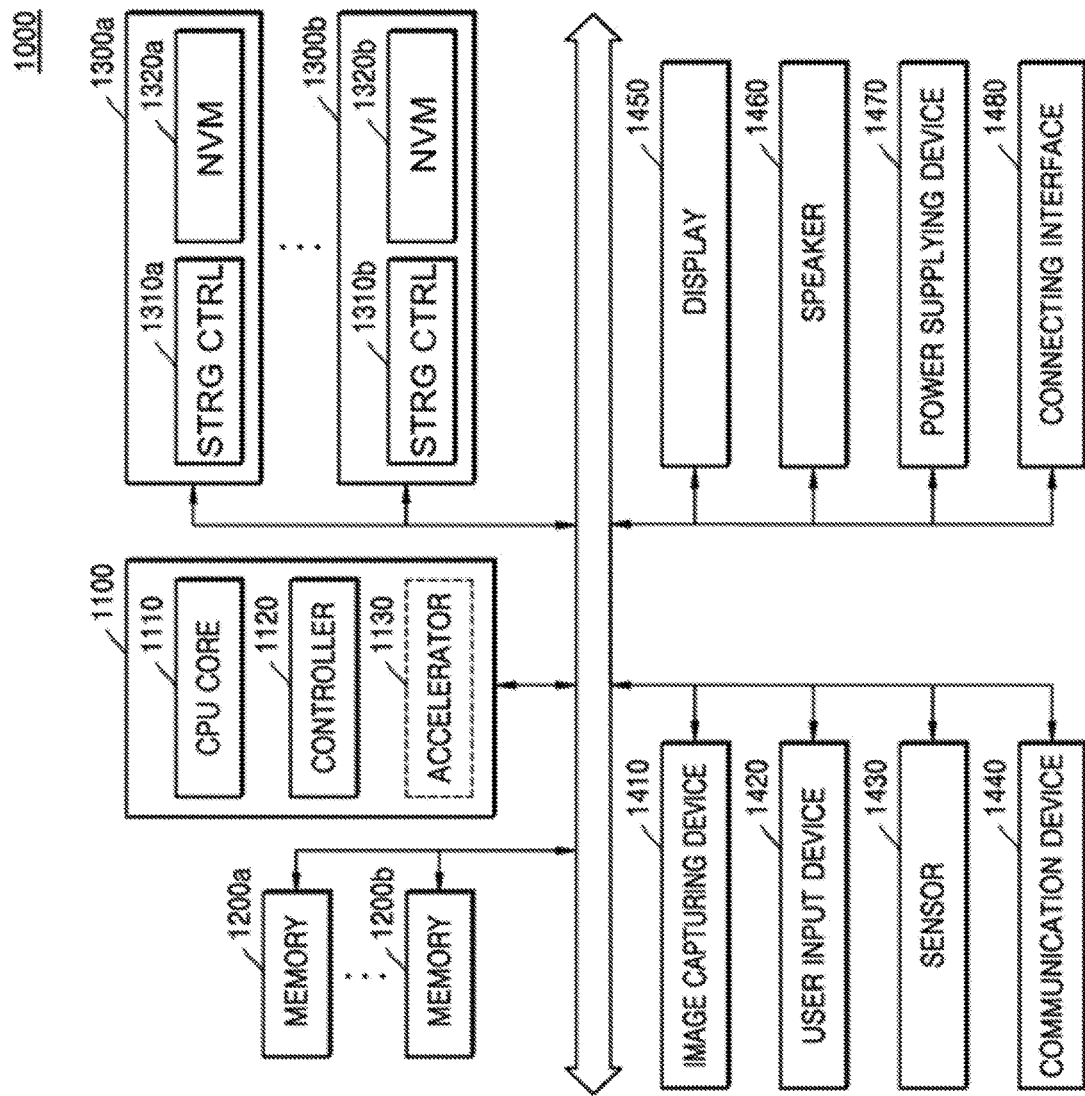
FIG. 1 is a block diagram of a computer system, according to embodiments.

FIG. 1 is a diagram of a system 1000 to which embodiments may be applied. The system 1000 of FIG. 1 may be, for example, a mobile system, such as a portable communication terminal (e.g., a mobile phone), a smartphone, a tablet personal computer (PC), a wearable device, a healthcare device, or an Internet of things (IOT) device. However, the system 1000 of FIG. 1 is not necessarily limited to the mobile system and may be a PC, a laptop computer, a server, a media player, or an automotive device (e.g., a navigation device).

Referring to FIG. 1, the system 1000 may include a main processor 1100, memories (e.g., 1200a and 1200b), and storage devices (e.g., 1300a and 1300b). In addition, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers (STRG CTRL) 1310a and 1310b and Non-Volatile Memories (NVMs) 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, embodiments are not limited thereto, and the NVMs 1320a and 1320b may include other types of NVMs, such as PRAM and/or RRAM.

The storage devices 1300a and 1300b may be physically separated from the main processor 1100 and included in the system 1000 or implemented in the same package as the main processor 1100. In addition, the storage devices 1300a and 1300b may have types of SSDs or memory cards, and may be removably combined with other components of the system 100 through an interface, such as the connecting interface 1480 described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery (not shown) embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

Figure 2A:
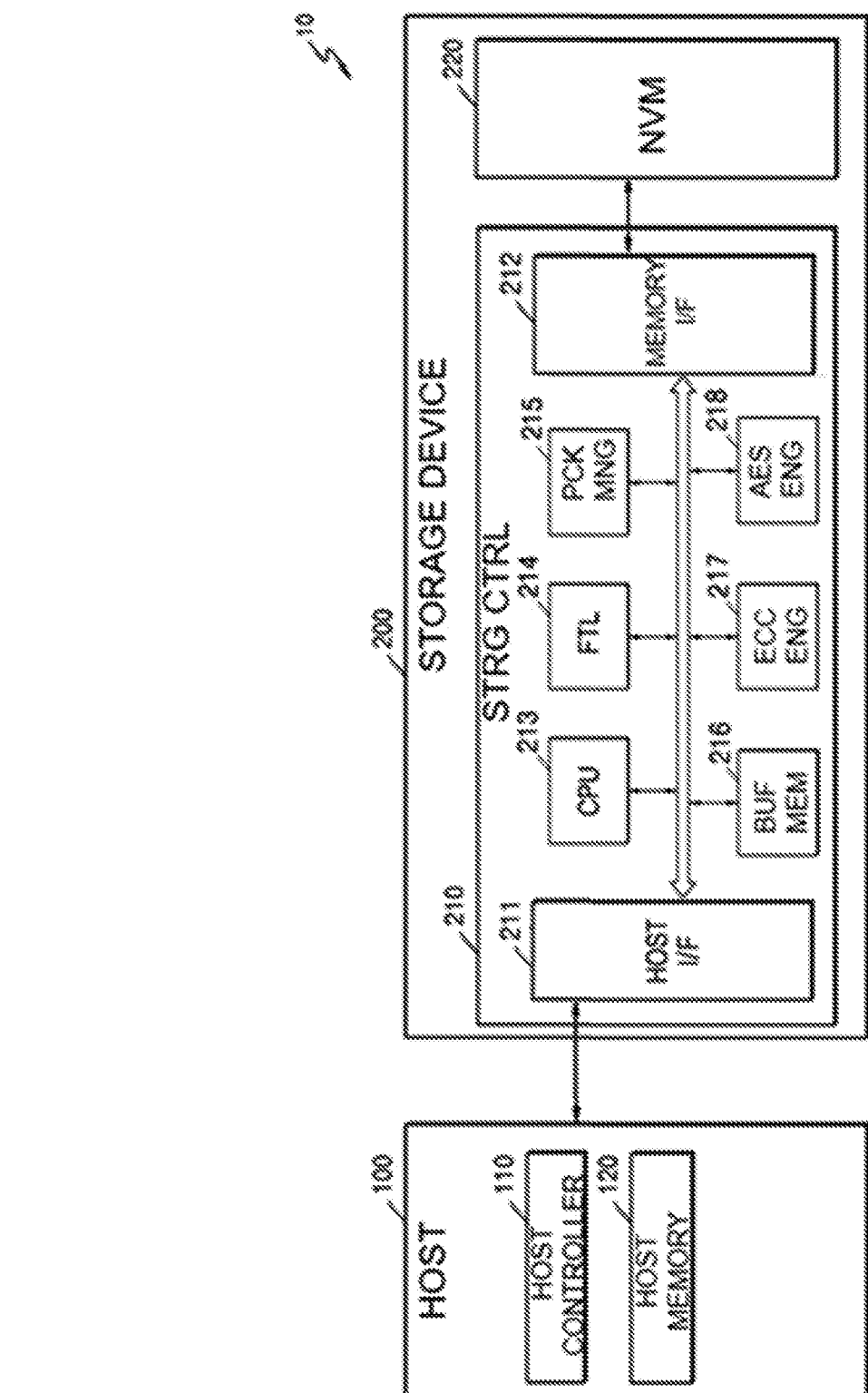
FIG. 2A is a block diagram of a host storage system, according to embodiments.

FIG. 2A is a block diagram of a host storage system 10 according to an example embodiment.

The host storage system 10 may include a host 100 and a storage device 200. Further, the storage device 200 may include a storage controller 210 and an NVM 220. According to an example embodiment, the host 100 may include a host controller 110 and a host memory 120. The host memory 120 may serve as a buffer memory configured to temporarily store data to be transmitted to the storage device 200 or data received from the storage device 200.

The storage device 200 may include storage media configured to store data in response to requests from the host 100. As an example, the storage device 200 may include at least one of an SSD, an embedded memory, and a removable external memory. When the storage device 200 is an SSD, the storage device 200 may be a device that conforms to an NVMe standard. When the storage device 200 is an embedded memory or an external memory, the storage device 200 may be a device that conforms to a UFS standard or an eMMC standard. Each of the host 100 and the storage device 200 may generate a packet according to an adopted standard protocol and transmit the packet.

When the NVM 220 of the storage device 200 includes a flash memory, the flash memory may include a 2D NAND memory array or a 3D (or vertical) NAND (VNAND) memory array. As another example, the storage device 200 may include various other kinds of NVMs. For example, the storage device 200 may include magnetic RAM (MRAM), spin-transfer torque MRAM, conductive bridging RAM (CBRAM), ferroelectric RAM (FRAM), PRAM, RRAM, and various other kinds of memories.

According to an embodiment, the host controller 110 and the host memory 120 may be implemented as separate semiconductor chips. Alternatively, in some embodiments, the host controller 110 and the host memory 120 may be integrated in the same semiconductor chip. As an example, the host controller 110 may be any one of a plurality of modules included in an application processor (AP). The AP may be implemented as a System on Chip (SoC). Further, the host memory 120 may be an embedded memory included in the AP or an NVM or memory module located outside the AP.

The host controller 110 may manage an operation of storing data (e.g., write data) of a buffer region of the host memory 120 in the NVM 220 or an operation of storing data (e.g., read data) of the NVM 220 in the buffer region.

The storage controller 210 may include a host interface 211, a memory interface 212, and a CPU 213. Further, the storage controllers 210 may further include a flash translation layer (FTL) 214, a packet manager 215, a buffer memory 216, an error correction code (ECC) engine 217, and an advanced encryption standard (AES) engine 218. The storage controllers 210 may further include a working memory (not shown) in which the FTL 214 is loaded. The CPU 213 may execute the FTL 214 to control data write and read operations on the NVM 220.

The host interface 211 may transmit and receive packets to and from the host 100. A packet transmitted from the host 100 to the host interface 211 may include a command or data to be written to the NVM 220. A packet transmitted from the host interface 211 to the host 100 may include a response to the command or data read from the NVM 220. The memory interface 212 may transmit data to be written to the NVM 220 to the NVM 220 or receive data read from the NVM 220. The memory interface 212 may be configured to comply with a standard protocol, such as Toggle or open NAND flash interface (ONFI).

The FTL 214 may perform various functions, such as an address mapping operation, a wear-leveling operation, and a garbage collection operation. The address mapping operation may be an operation of converting a logical address received from the host 100 into a physical address used to actually store data in the NVM 220. The wear-leveling operation may be a technique for preventing excessive deterioration of a specific block by allowing blocks of the NVM 220 to be uniformly used. As an example, the wear-leveling operation may be implemented using a firmware technique that balances erase counts of physical blocks. The garbage collection operation may be a technique for ensuring usable capacity in the NVM 220 by erasing an existing block after copying valid data of the existing block to a new block.

The packet manager 215 may generate a packet according to a protocol of an interface, which consents to the host 100, or parse various types of information from the packet received from the host 100. In addition, the buffer memory 216 may temporarily store data to be written to the NVM 220 or data to be read from the NVM 220. Although the buffer memory 216 may be a component included in the storage controllers 210, the buffer memory 216 may be outside the storage controllers 210.

The ECC engine 217 may perform error detection and correction operations on read data read from the NVM 220. More specifically, the ECC engine 217 may generate parity bits for write data to be written to the NVM 220, and the generated parity bits may be stored in the NVM 220 together with write data. During the reading of data from the NVM 220, the ECC engine 217 may correct an error in the read data by using the parity bits read from the NVM 220 along with the read data, and output error-corrected read data.

The AES engine 218 may perform at least one of an encryption operation and a decryption operation on data input to the storage controllers 210 by using a symmetric-key algorithm.

Figure 2B:
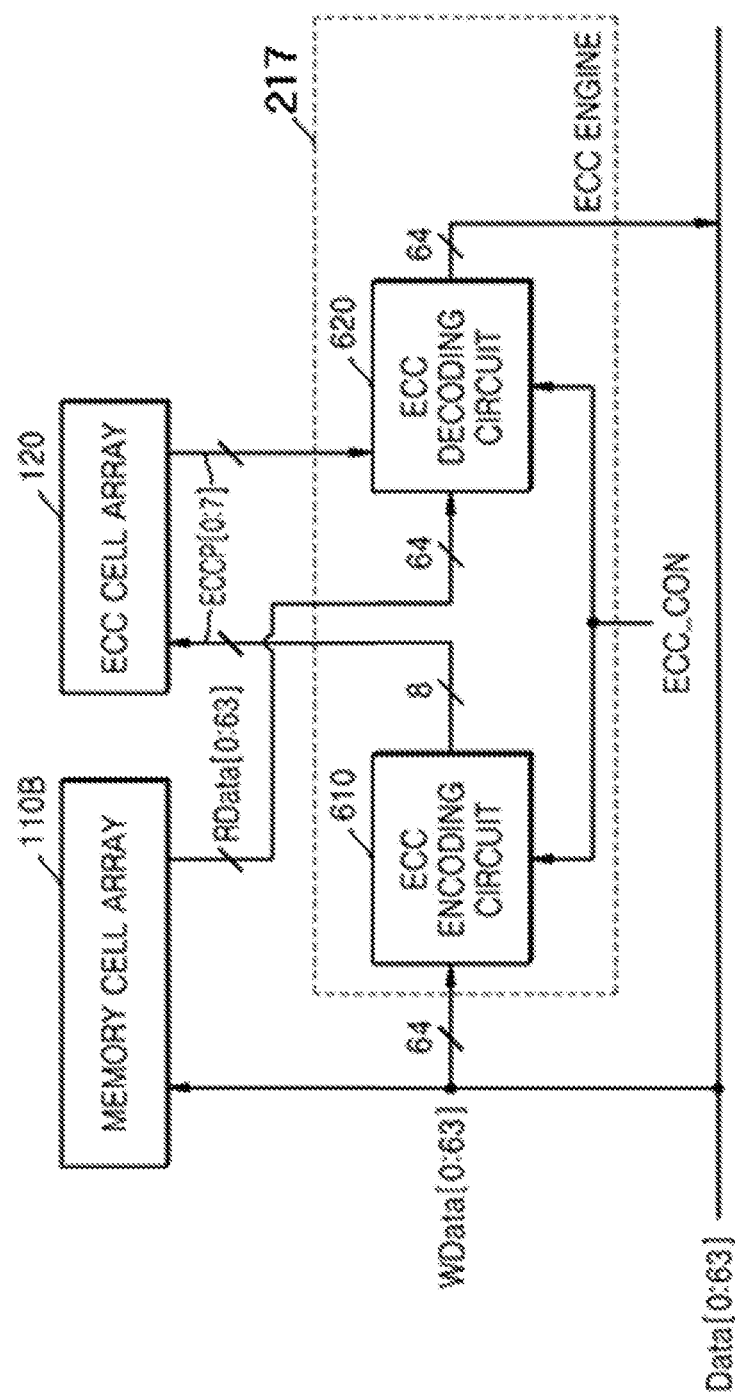
FIG. 2B is a block diagram of an ECC engine, according to embodiments.

FIG. 2B is a detailed diagram of the ECC engine 217 of FIG. 2A. Referring to FIG. 2B, the ECC engine 217 may include an ECC encoding circuit 510 and an ECC decoding circuit 520. In response to an ECC control signal ECC_CON, the ECC encoding circuit 510 may generate parity bits ECCP[0:7] for write data WData[0:63] to be written to memory cells of a memory cell array 221. The parity bits ECCP[0:7] may be stored in an ECC cell array 223. According to embodiments, in response to the ECC control signal ECC_CON, the ECC encoding circuit 510 may generate parity bits ECCP[0:7] for write data WData[0:63] to be written to memory cells including a defective cell of the memory cell array 221.

In response to the ECC control signal ECC_CON, the ECC decoding circuit 520 may correct error bit data by using read data RData[0:63] read from the memory cells of the memory cell array 221 and parity bits ECCP[0:7] read from the ECC cell array 223 and output error-corrected data Data[0:63]. According to embodiments, in response to the ECC control signal ECC_CON, the ECC decoding circuit 520 may correct error bit data by using read data RData[0:63] read from memory cells including a defective cell of the memory cell array 221 and parity bits ECCP[0:7] read from the ECC cell array 223, and output error-corrected data Data[0:63].

Figure 2C:
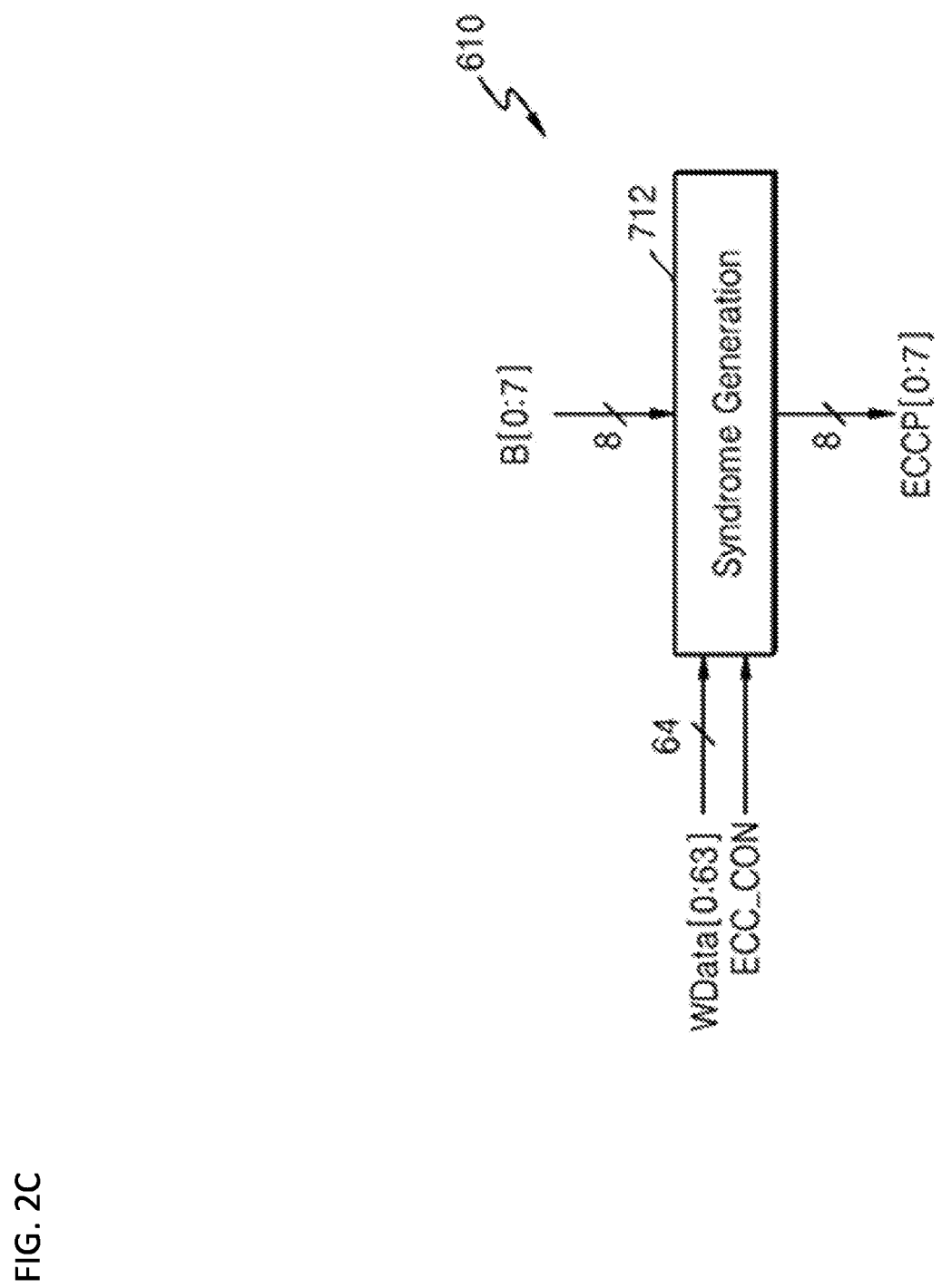
FIG. 2C is a block diagram of an ECC encoding circuit, according to embodiments.

FIG. 2C is a diagram of the ECC encoding circuit 510 of FIG. 2B.

Referring to FIG. 2C, the ECC encoding circuit 510 may include a parity generator 511, which receives 64-bit write data WData[0:63] and basis bits B[0:7] in response to an ECC control signal ECC_CON and generates parity bits ECCP[0:7] by using an XOR array operation. The basis bits B[0:7] may be bits for generating parity bits ECCP[0:7] for 64-bit write data WData[0:63], for example, b'00000000 bits. The basis bits B[0:7] may use other specific bits instead of b'00000000 bits.

Figure 2D:
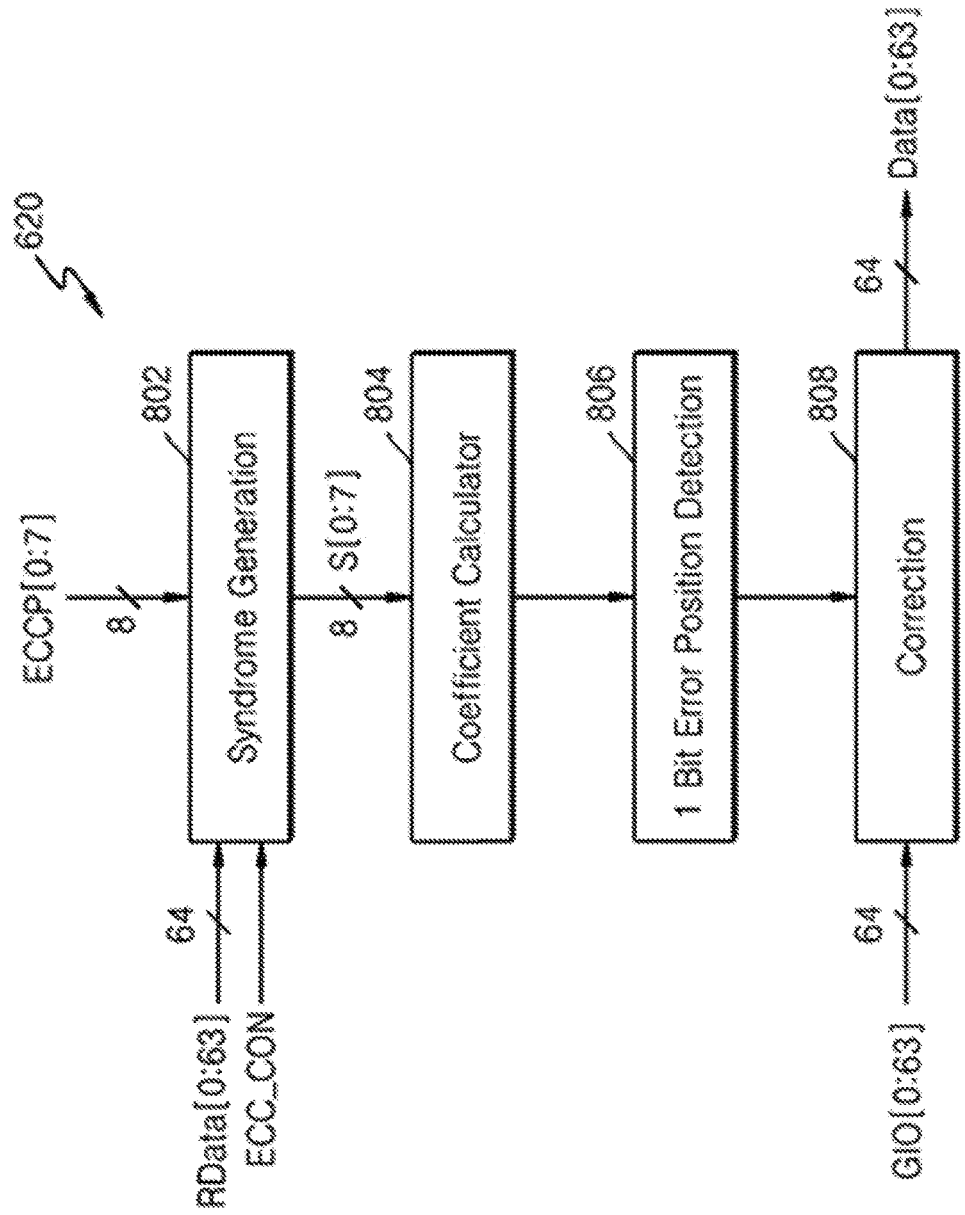
FIG. 2D is a block diagram of an ECC decoding circuit, according to embodiments.

FIG. 2D is a diagram of an ECC decoding circuit 520 of FIG. 2B.

Referring to FIG. 2D, the ECC decoding circuit 520 may include a syndrome generator 521, a coefficient calculator 522, a 1-bit error position detector 523, and an error corrector 524. The syndrome generator 521 may receive 64-bit read data and an 8-bit parity bit ECCP[0:7] in response to an ECC control signal ECC_CON and generate syndrome data S[0:7] by using an XOR array operation. The coefficient calculator 522 may calculate a coefficient of an error position equation by using the syndrome data S[0:7]. The error position equation may be an equation that takes a reciprocal of an error bit as a root. The 1-bit error position detector 523 may calculate a position of a 1-bit error by using the calculated error position equation. The error corrector 524 may determine the position of the 1-bit error based on a detection result of the 1-bit error position detector 523. The error corrector 524 may correct an error by inverting a logic value of a bit of which an error occurs, from among 64-bit read data RData[0:63], based on determined 1-bit error position information, and output error-corrected 64-bit data Data[0:63].

In embodiments, the error position equation may correspond to the ELP described herein.

Figure 2E:
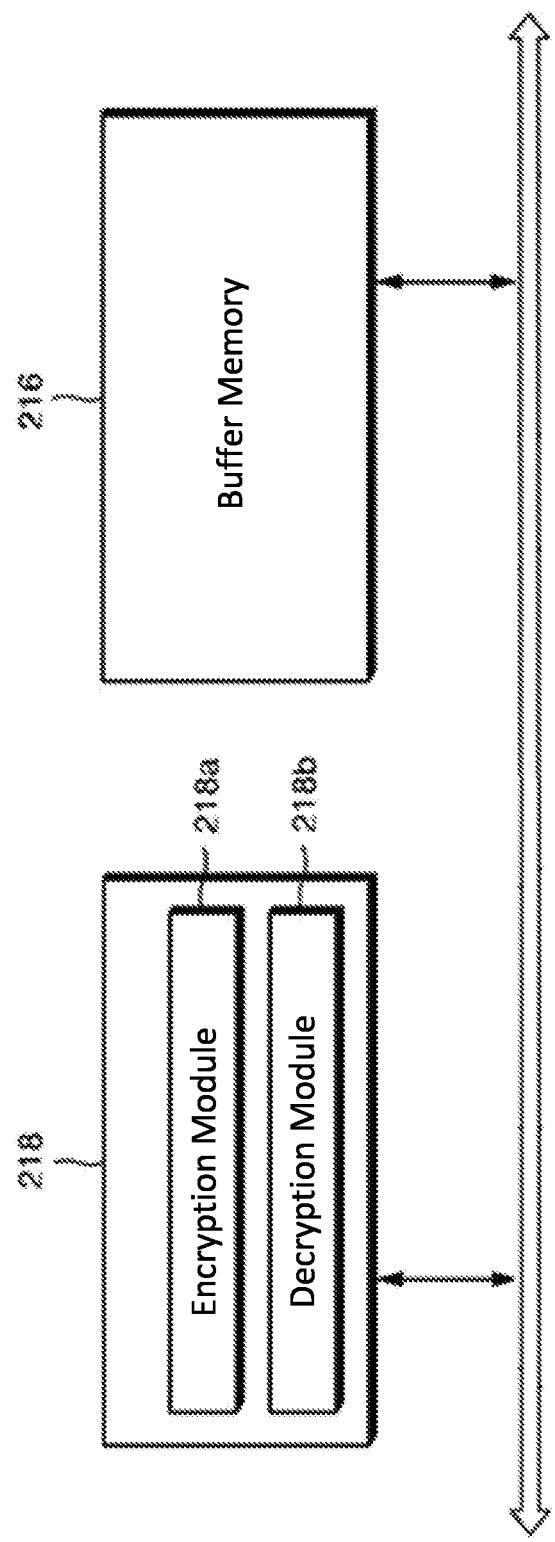
FIG. 2E is a block diagram of an AES engine, according to embodiments.

FIG. 2E is a detailed diagram of the AES engine 218 of FIG. 2A. The AES engine 218 may encrypt and decrypt data by using an AES algorithm and include an encryption module 218a and a decryption module 218b. Although FIG. 2E illustrates a case in which the encryption module 218a and the decryption module 218b are implemented as separate modules, in another case, one module capable of performing both encryption and decryption operations may be implemented in the AES engine 218. A buffer memory 216 may be a volatile memory serving as a buffer or be an NVM.

The AES engine 218 may receive first data transmitted from the buffer memory 216. The encryption module 218a may encrypt the first data, which is transmitted from the buffer memory 216, by using an encryption key and generate second data. The second data may be transmitted from the AES engine 218 to the buffer memory 216, and be stored in the buffer memory 216.

In addition, the AES engine 218 may receive third data transmitted from the buffer memory 216. The third data may be data that is encrypted with the same encryption key as an encryption key used to encrypt the first data. The decryption module 218b may decrypt the third data, which is transmitted from the buffer memory 216, with the same encryption key as the encryption key used to encrypt the first data and generate fourth data. The fourth data may be transmitted from the AES engine 218 to the buffer memory 216, and be stored in the buffer memory 216.

Figure 3:
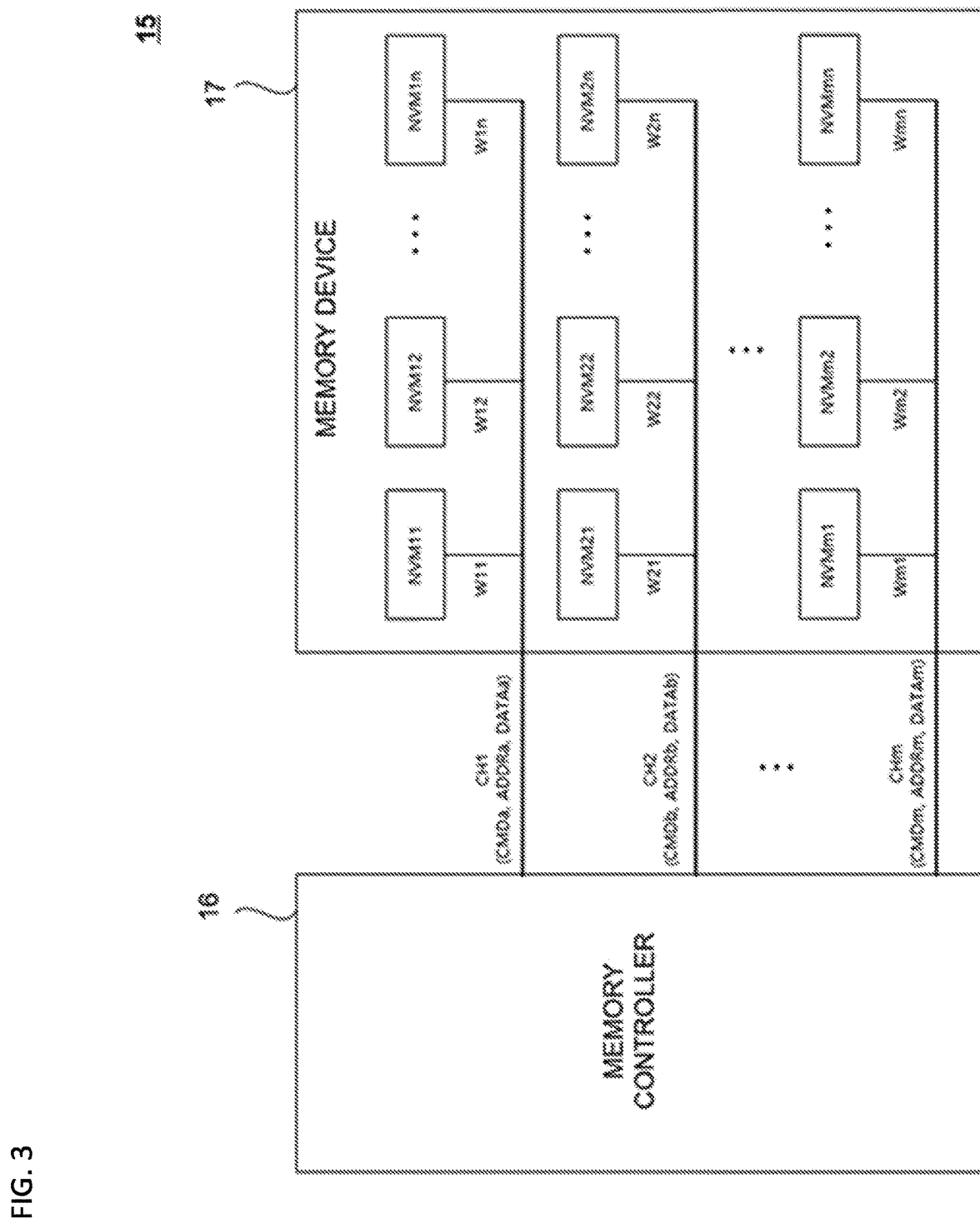
FIG. 3 is a block diagram of a memory system, according to embodiments.

FIG. 3 is a block diagram of a memory system 15 according to embodiments.

Referring to FIG. 3, the memory system 15 may include a memory device 17 and a memory controller 16. The memory system 15 may support a plurality of channels CH1 to CHm, and the memory device 17 may be connected to the memory controller 16 through the plurality of channels CH1 to CHm. For example, the memory system 15 may be implemented as a storage device, such as an SSD.

The memory device 17 may include a plurality of NVM devices NVM11 to NVMmn. Each of the NVM devices NVM11 to NVMmn may be connected to one of the plurality of channels CH1 to CHm through a way corresponding thereto. For instance, the NVM devices NVM11 to NVM1$n$ may be connected to a first channel CH1 through ways W11 to W1$n$, and the NVM devices NVM21 to NVM2$n$ may be connected to a second channel CH2 through ways W21 to W2$n$. In an example embodiment, each of the NVM devices NVM11 to NVMmn may be implemented as an arbitrary memory unit that may operate according to an individual command from the memory controller 16. For example, each of the NVM devices NVM11 to NVMmn may be implemented as a chip or a die, but the inventive concept is not limited thereto.

The memory controller 16 may transmit and receive signals to and from the memory device 17 through the plurality of channels CH1 to CHm. For example, the memory controller 16 may transmit commands CMDa to CMDm, addresses ADDRa to ADDRm, and data DATAa to DATAm to the memory device 17 through the channels CH1 to CHm or receive the data DATAa to DATAm from the memory device 17.

The memory controller 16 may select one of the NVM devices NVM11 to NVMmn, which is connected to each of the channels CH1 to CHm, by using a corresponding one of the channels CH1 to CHm, and transmit and receive signals to and from the selected NVM device. For example, the memory controller 16 may select the NVM device NVM11 from the NVM devices NVM11 to NVM1$n$ connected to the first channel CH1. The memory controller 16 may transmit the command CMDa, the address ADDRa, and the data DATAa to the selected NVM device NVM11 through the first channel CH1 or receive the data DATAa from the selected NVM device NVM11.

The memory controller 16 may transmit and receive signals to and from the memory device 17 in parallel through different channels. For example, the memory controller 16 may transmit a command CMDb to the memory device 17 through the second channel CH2 while transmitting a command CMDa to the memory device 17 through the first channel CH1. For example, the memory controller 16 may receive data DATAb from the memory device 17 through the second channel CH2 while receiving data DATAa from the memory device 17 through the first channel CH1.

The memory controller 16 may control all operations of the memory device 17. The memory controller 16 may transmit a signal to the channels CH1 to CHm and control each of the NVM devices NVM11 to NVMmn connected to the channels CH1 to CHm. For instance, the memory controller 16 may transmit the command CMDa and the address ADDRa to the first channel CH1 and control one selected from the NVM devices NVM11 to NVM1n.

Each of the NVM devices NVM11 to NVMmn may operate via the control of the memory controller 16. For example, the NVM device NVM11 may program the data DATAa based on the command CMDa, the address ADDRa, and the data DATAa provided to the first channel CH1. For example, the NVM device NVM21 may read the data DATAb based on the command CMDb and the address ADDb provided to the second channel CH2 and transmit the read data DATAb to the memory controller 16.

Although FIG. 3 illustrates an example in which the memory device 17 communicates with the memory controller 16 through m channels and includes n NVM devices corresponding to each of the channels, the number of channels and the number of NVM devices connected to one channel may be variously changed.

Figure 4:
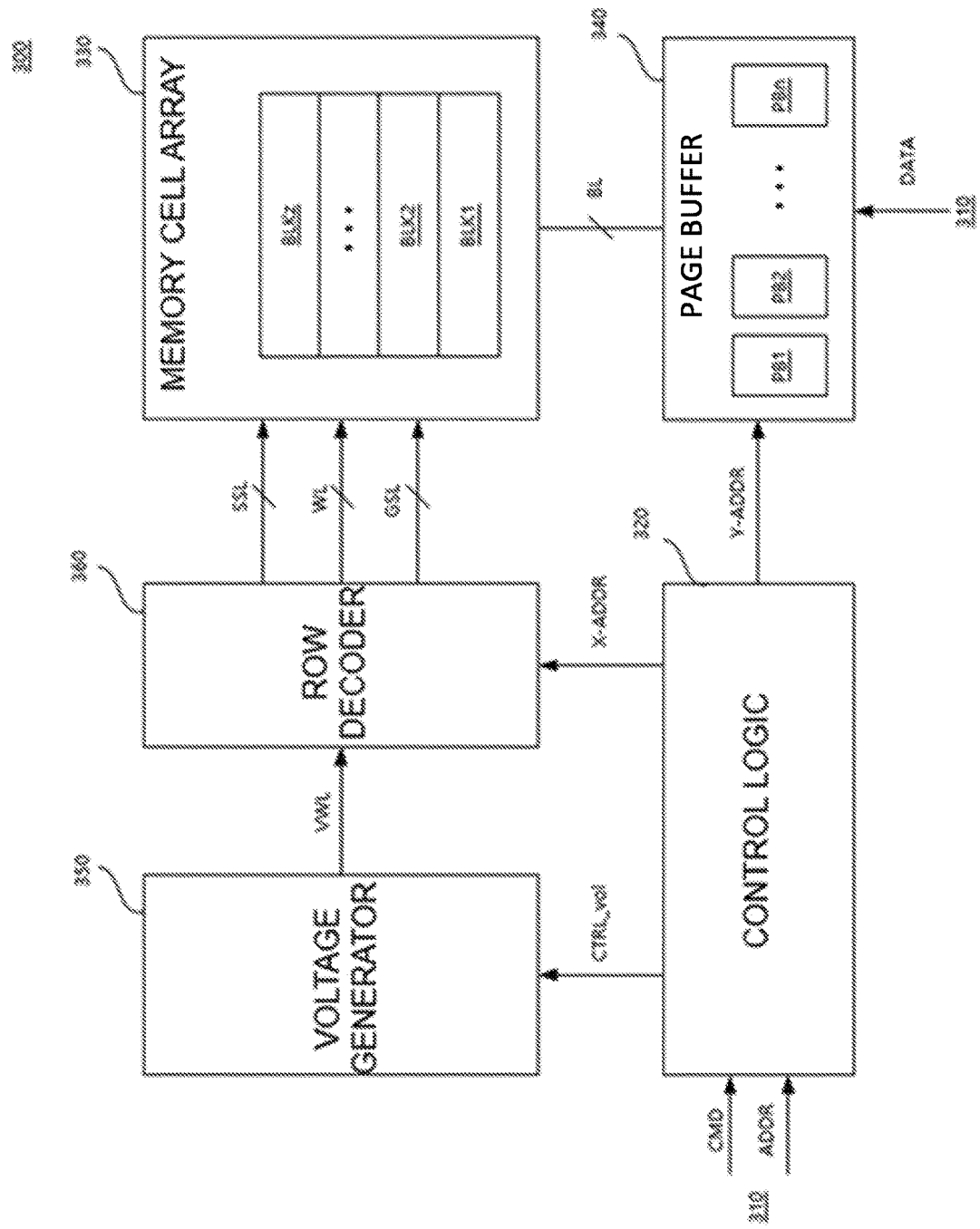
FIG. 4 is a block diagram of a memory device, according to embodiments.

FIG. 4 is a block diagram of a memory device 300 according to an example embodiment. Referring to FIG. 4, the memory device 300 may include a control logic circuitry 320, a memory cell array 330, a page buffer 340, a voltage generator 350, and a row decoder 360. Although not shown in FIG. 4, the memory device 300 may further include a memory interface circuitry 310 shown in FIG. 6. In addition, the memory device 300 may further include a column logic, a pre-decoder, a temperature sensor, a command decoder, and/or an address decoder.

The control logic circuitry 320 may control all various operations of the memory device 300. The control logic circuitry 320 may output various control signals in response to commands CMD and/or addresses ADDR from the memory interface circuitry 310. For example, the control logic circuitry 320 may output a voltage control signal CTRL_vol, a row address X-ADDR, and a column address Y-ADDR.

The memory cell array 330 may include a plurality of memory blocks BLK1 to BLKz (here, z is a positive integer), each of which may include a plurality of memory cells. The memory cell array 330 may be connected to the page buffer 340 through bit lines BL and be connected to the row decoder 360 through word lines WL, string selection lines SSL, and ground selection lines GSL.

In an example embodiment, the memory cell array 330 may include a 3D memory cell array, which includes a plurality of NAND strings. Each of the NAND strings may include memory cells respectively connected to word lines vertically stacked on a substrate. The disclosures of U.S. Pat. Nos. 7,679,133; 8,553,466; 8,654,587; 8,559,235; and US Pat. Pub. No. 2011/0233648 are hereby incorporated by reference. In an example embodiment, the memory cell array 330 may include a 2D memory cell array, which includes a plurality of NAND strings arranged in a row direction and a column direction.

The page buffer 340 may include a plurality of page buffers PB1 to PBn (here, n is an integer greater than or equal to 3), which may be respectively connected to the memory cells through a plurality of bit lines BL. The page buffer 340 may select at least one of the bit lines BL in response to the column address Y-ADDR. The page buffer 340 may operate as a write driver or a sense amplifier according to an operation mode. For example, during a program operation, the page buffer 340 may apply a bit line voltage corresponding to data to be programmed, to the selected bit line. During a read operation, the page buffer 340 may sense current or a voltage of the selected bit line BL and sense data stored in the memory cell.

The voltage generator 350 may generate various kinds of voltages for program, read, and erase operations based on the voltage control signal CTRL_vol. For example, the voltage generator 350 may generate a program voltage, a read voltage, a program verification voltage, and an erase voltage as a word line voltage VWL.

The row decoder 360 may select one of a plurality of word lines WL and select one of a plurality of string selection lines SSL in response to the row address X-ADDR. For example, the row decoder 360 may apply the program voltage and the program verification voltage to the selected word line WL during a program operation and apply the read voltage to the selected word line WL during a read operation.

Figure 5:
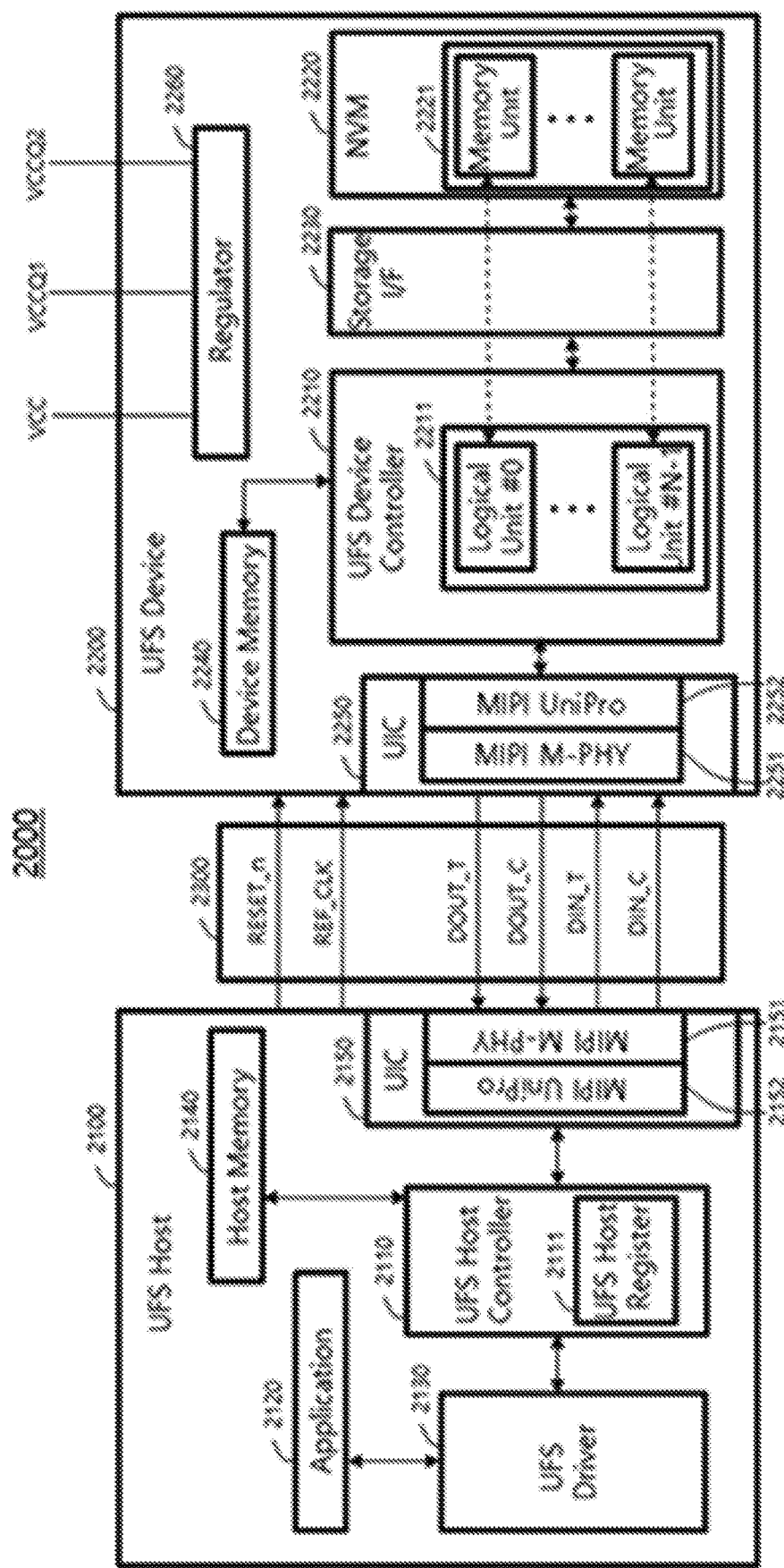
FIG. 5 is a block diagram of a UFS system, according to embodiments.

FIG. 5 is a diagram of a UFS system 2000 according to embodiments. The UFS system 2000 may be a system conforming to a UFS standard announced by Joint Electron Device Engineering Council (JEDEC) and include a UFS host 2100, a UFS device 2200, and a UFS interface 2300. The above description of the system 1000 of FIG. 1 may also be applied to the UFS system 2000 of FIG. 5 within a range that does not conflict with the following description of FIG. 5.

Referring to FIG. 5, the UFS host 2100 may be connected to the UFS device 2200 through the UFS interface 2300. When the main processor 1100 of FIG. 1 is an AP, the UFS host 2100 may be implemented as a portion of the AP. The UFS host controller 2110 and the host memory 2140 may respectively correspond to the controller 1120 of the main processor 1100 and the memories 1200a and 1200b of FIG. 1. The UFS device 2200 may correspond to the storage device 1300a and 1300b of FIG. 1, and a UFS device controller 2210 and an NVM 2220 may respectively correspond to the storage controllers 1310a and 1310b and the NVMs 1320a and 1320b of FIG. 1.

The UFS host 2100 may include a UFS host controller 2110, an application 2120, a UFS driver 2130, a host memory 2140, and a UFS interconnect (UIC) layer 2150. The UFS device 2200 may include the UFS device controller 2210, the NVM 2220, a storage interface 2230, a device memory 2240, a UIC layer 2250, and a regulator 2260. The NVM 2220 may include a plurality of memory units 2221. Although each of the memory units 2221 may include a V-NAND flash memory having a 2D structure or a 3D structure, each of the memory units 2221 may include another kind of NVM, such as PRAM and/or RRAM. The UFS device controller 2210 may be connected to the NVM 2220 through the storage interface 2230. The storage interface 2230 may be configured to comply with a standard protocol, such as Toggle or ONFI.

The application 2120 may refer to a program that wants to communicate with the UFS device 2200 to use functions of the UFS device 2200. The application 2120 may transmit input-output requests (IORs) to the UFS driver 2130 for input/output (I/O) operations on the UFS device 2200. The IORs may refer to a data read request, a data storage (or write) request, and/or a data erase (or discard) request, without being limited thereto.

The UFS driver 2130 may manage the UFS host controller 2110 through a UFS-host controller interface (UFS-HCI). The UFS driver 2130 may convert the IOR generated by the application 2120 into a UFS command defined by the UFS standard and transmit the UFS command to the UFS host controller 2110. One IOR may be converted into a plurality of UFS commands. Although the UFS command may basically be defined by an SCSI standard, the UFS command may be a command dedicated to the UFS standard.

The UFS host controller 2110 may transmit the UFS command converted by the UFS driver 2130 to the UIC layer 2250 of the UFS device 2200 through the UIC layer 2150 and the UFS interface 2300. During the transmission of the UFS command, a UFS host register 2111 of the UFS host controller 2110 may serve as a command queue (CQ).

The UIC layer 2150 on the side of the UFS host 2100 may include a mobile industry processor interface (MIPI) M-PHY 2151 and an MIPI UniPro 2152, and the UIC layer 2250 on the side of the UFS device 2200 may also include an MIPI M-PHY 2251 and an MIPI UniPro 2252.

The UFS interface 2300 may include a line configured to transmit a reference clock signal REF_CLK, a line configured to transmit a hardware reset signal RESET_n for the UFS device 2200, a pair of lines configured to transmit a pair of differential input signals DIN_t and DIN_c, and a pair of lines configured to transmit a pair of differential output signals DOUT_t and DOUT_c.

A frequency of a reference clock signal REF_CLK provided from the UFS host 2100 to the UFS device 2200 may be one of 19.2 MHz, 26 MHz, 38.4 MHz, and 52 MHz, without being limited thereto. The UFS host 2100 may change the frequency of the reference clock signal REF_CLK during an operation, that is, during data transmission/receiving operations between the UFS host 2100 and the UFS device 2200. The UFS device 2200 may generate cock signals having various frequencies from the reference clock signal REF_CLK provided from the UFS host 2100, by using a phase-locked loop (PLL). Also, the UFS host 2100 may set a data rate between the UFS host 2100 and the UFS device 2200 by using the frequency of the reference clock signal REF_CLK. That is, the data rate may be determined depending on the frequency of the reference clock signal REF_CLK.

The UFS interface 2300 may support a plurality of lanes, each of which may be implemented as a pair of differential lines. For example, the UFS interface 2300 may include at least one receiving lane and at least one transmission lane. In FIG. 5, a pair of lines configured to transmit a pair of differential input signals DIN_T and DIN_C may constitute a receiving lane, and a pair of lines configured to transmit a pair of differential output signals DOUT_T and DOUT_C may constitute a transmission lane. Although one transmission lane and one receiving lane are illustrated in FIG. 5, the number of transmission lanes and the number of receiving lanes may be changed.

The receiving lane and the transmission lane may transmit data based on a serial communication scheme. Full-duplex communications between the UFS host 2100 and the UFS device 2200 may be enabled due to a structure in which the receiving lane is separated from the transmission lane. That is, while receiving data from the UFS host 2100 through the receiving lane, the UFS device 2200 may transmit data to the UFS host 2100 through the transmission lane. In addition, control data (e.g., a command) from the UFS host 2100 to the UFS device 2200 and user data to be stored in or read from the NVM 2220 of the UFS device 2200 by the UFS host 2100 may be transmitted through the same lane. Accordingly, between the UFS host 2100 and the UFS device 2200, there may be no need to further provide a separate lane for data transmission in addition to a pair of receiving lanes and a pair of transmission lanes.

The UFS device controller 2210 of the UFS device 2200 may control all operations of the UFS device 2200. The UFS device controller 2210 may manage the NVM 2220 by using a logical unit (LU) 2211, which is a logical data storage unit. The number of LUs 2211 may be 8, without being limited thereto. The UFS device controller 2210 may include an FTL and convert a logical data address (e.g., a logical block address (LBA)) received from the UFS host 2100 into a physical data address (e.g., a physical block address (PBA)) by using address mapping information of the FTL. A logical block configured to store user data in the UFS system 2000 may have a size in a predetermined range. For example, a minimum size of the logical block may be set to 4 Kbyte.

When a command from the UFS host 2100 is applied through the UIC layer 2250 to the UFS device 2200, the UFS device controller 2210 may perform an operation in response to the command and transmit a completion response to the UFS host 2100 when the operation is completed.

As an example, when the UFS host 2100 intends to store user data in the UFS device 2200, the UFS host 2100 may transmit a data storage command to the UFS device 2200. When a response (a 'ready-to-transfer' response) indicating that the UFS host 2100 is ready to receive user data (ready-to-transfer) is received from the UFS device 2200, the UFS host 2100 may transmit user data to the UFS device 2200. The UFS device controller 2210 may temporarily store the received user data in the device memory 2240 and store the user data, which is temporarily stored in the device memory 2240, at a selected position of the NVM 2220 based on the address mapping information of the FTL.

As another example, when the UFS host 2100 intends to read the user data stored in the UFS device 2200, the UFS host 2100 may transmit a data read command to the UFS device 2200. The UFS device controller 2210, which has received the command, may read the user data from the NVM 2220 based on the data read command and temporarily store the read user data in the device memory 2240. During the read operation, the UFS device controller 2210 may detect and correct an error in the read user data by using an ECC engine (not shown) embedded therein. More specifically, the ECC engine may generate parity bits for write data to be written to the NVM 2220, and the generated parity bits may be stored in the NVM 2220 along with the write data. During the reading of data from the NVM 2220, the ECC engine may correct an error in read data by using the parity bits read from the NVM 2220 along with the read data, and output error-corrected read data.

In addition, the UFS device controller 2210 may transmit user data, which is temporarily stored in the device memory 2240, to the UFS host 2100. In addition, the UFS device controller 2210 may further include an AES engine (not shown). The AES engine may perform at least of an encryption operation and a decryption operation on data transmitted to the UFS device controller 2210 by using a symmetric-key algorithm.

The UFS host 2100 may sequentially store commands, which are to be transmitted to the UFS device 2200, in the UFS host register 2111, which may serve as a common queue, and sequentially transmit the commands to the UFS device 2200. In this case, even while a previously transmitted command is still being processed by the UFS device 2200, that is, even before receiving a notification that the previously transmitted command has been processed by the UFS device 2200, the UFS host 2100 may transmit a next command, which is on standby in the CQ, to the UFS device 2200. Thus, the UFS device 2200 may also receive a next command from the UFS host 2100 during the processing of the previously transmitted command. A maximum number (or queue depth) of commands that may be stored in the CQ may be, for example, 32. Also, the CQ may be implemented as a circular queue in which a start and an end of a command line stored in a queue are indicated by a head pointer and a tail pointer.

Each of the plurality of memory units 2221 may include a memory cell array (not shown) and a control circuit (not shown) configured to control an operation of the memory cell array. The memory cell array may include a 2D memory cell array or a 3D memory cell array. The memory cell array may include a plurality of memory cells. Although each of the memory cells is a single-level cell (SLC) configured to store 1-bit information, each of the memory cells may be a cell configured to store information of 2 bits or more, such as a multi-level cell (MLC), a triple-level cell (TLC), and a quadruple-level cell (QLC). The 3D memory cell array may include a vertical NAND string in which at least one memory cell is vertically oriented and located on another memory cell.

Voltages VCC, VCCQ, and VCCQ2 may be applied as power supply voltages to the UFS device 2200. The voltage VCC may be a main power supply voltage for the UFS device 2200 and be in a range of 2.4 V to 3.6 V. The voltage VCCQ may be a power supply voltage for supplying a low voltage mainly to the UFS device controller 2210 and be in a range of 1.14 V to 1.26 V. The voltage VCCQ2 may be a power supply voltage for supplying a voltage, which is lower than the voltage VCC and higher than the voltage VCCQ, mainly to an I/O interface, such as the MIPI M-PHY 2251, and be in a range of 1.7 V to 1.95 V. The power supply voltages may be supplied through the regulator 2260 to respective components of the UFS device 2200. The regulator 2260 may be implemented as a set of unit regulators respectively connected to different ones of the power supply voltages described above.

As discussed above, embodiments may relate to determining an initial ELP polynomial which may include terms corresponding to all symbols or frames which have yet to be decoded. Then, when a frame j is successfully decoded, the initial ELP may be modified to reflect this successful decoding by dividing the ELP by a monomial $(1-\alpha^j)$ which corresponds to the decoded frame j.

As an example, polynomials g(x) and f(x) may be provided as shown in Equation 1 and Equation 2 below:

$$g(x) = g_0 + g_1 x + \ldots + g_n x^n \quad \text{Equation 1}$$

$$f(x) = (1 + \alpha^j x) g(x) \quad \text{Equation 2}$$

In order to obtain or restore the polynomial g(x) from the polynomial f(x) may be seen as dividing the polynomial f(x) by the monomial $(1+\alpha^j x)$.

Considering the relationship between each coefficient $f_i$ of f(x) and $g_i$ of g(x), it may be seen that these coefficients satisfy Equation 3 and Equation 4 below:

$$f_i = g_i + \alpha^j g_{i-1} \quad \text{Equation 3}$$

$$g_0 = f_0 \quad \text{Equation 4}$$

As a result, each of the coefficients of g(x) may be iteratively calculated in an order from the lowest-order coefficient to the highest-order coefficient according to Equation 4 below:

$$g_i = f_i - \alpha^j g_{i-1} \quad \text{Equation 5}$$

In addition, if it is known that the polynomial degree of f(x) and g(x) decreases, Equation 5 below may be satisfied:

$$g_{n+1} = 0 \quad \text{Equation 6}$$

As a result, the coefficients of g(x) may be iteratively calculated in an order from the highest-order coefficient to the lowest-order coefficient according to Equation 6 below:

$$g_i = \frac{f_{i+1} - g_{i+1}}{\alpha^j} \quad \text{Equation 7}$$

Equation 7 and Equation 8 below provide examples of f(x) and g(x) which may be used to illustrate such calculations:

$$g(x) = Ax^2 + Bx + C \quad \text{Equation 8}$$

$$f(x) = (1 + Dx)g(x) = AD^3 + (A + DB)x^2 + (B + DC)x + C$$

For the examples of f(x) and g(x) shown in Equation 7 and Equation 8, the coefficients of f(x) may be expressed according to Equations 9-12 below:

$$f_3 = AD \quad \text{Equation 9}$$

$$f_2 = (A + DB) \quad \text{Equation 10}$$

$$f_1 = (B + DC) \quad \text{Equation 11}$$

$$f_0 = C \quad \text{Equation 12}$$

According to embodiments, if these coefficients $f_3$, $f_2$, $f_1$, and $f_0$, are known, and the monomial (1+Dx) is known, and if it is known that the polynomial degree of f(x) and g(x) decreases, then the coefficients of g(x) may be determined sequentially from lowest-order to highest-order according to Equations 13-15 below:

$$g_0 = f_0 = C \qquad \text{Equation 13}$$

$$g_1 = f_1 - Dg_0 = (B + DC) - DC = B \qquad \text{Equation 14}$$

$$g_2 = f_2 - Dg_1 = (A + DB) - DB = A \qquad \text{Equation 15}$$

In addition, the coefficients of g(x) may also be determined sequentially from highest-order to lowest-order according to Equations 16-18 below:

$$g_2 = \frac{f_3 - 0}{D} = \frac{AD - 0}{D} = A \qquad \text{Equation 16}$$

$$g_1 = \frac{f_2 - g_2}{D} = \frac{(A + DB) - A}{D} = B \qquad \text{Equation 17}$$

$$g_0 = \frac{f_1 - 1}{D} = \frac{(B + D) - B}{D} = C \qquad \text{Equation 18}$$

In embodiments, the polynomial division operations shown in the equations above may be performed for any division task involving polynomials, as long as the polynomial being divided is divisible by the divisor. Accordingly, although these operations are explained herein in a context of ECC decoding, embodiments may be applied in any appropriate context, for example divisions involving decimals, etc.

Figure 6:
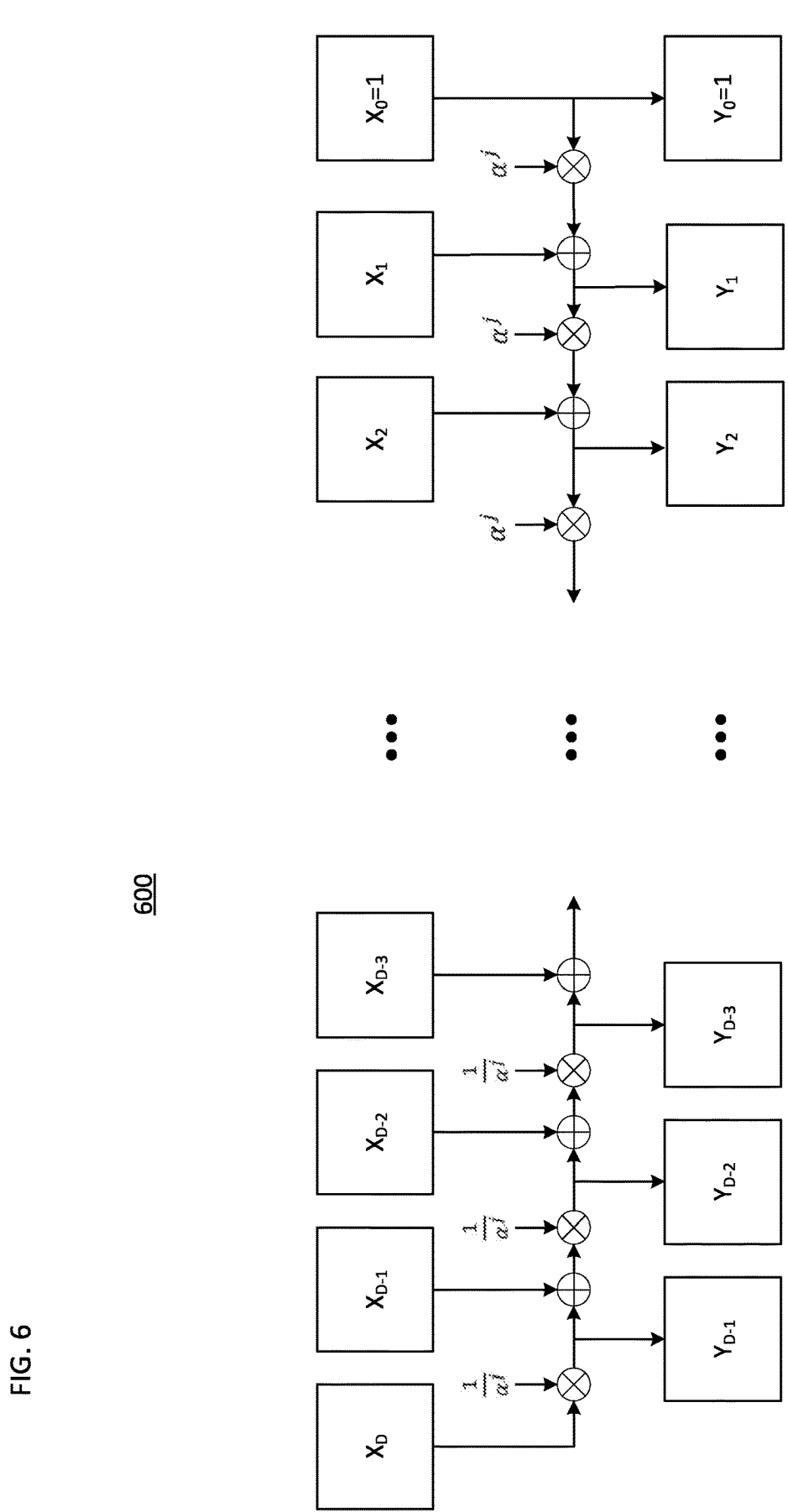
FIG. 6 is a block diagram of division module, according to embodiments.

FIG. 6 is a block diagram illustrating an example implementation of the polynomial division described above. As shown in FIG. 6, a division module 600 may be used to divide a first polynomial of degree D, having the coefficients $X_D$, ..., $X_0$, by a monomial $(1-\alpha^j)$, in order to obtain a second polynomial of degree D−1, having the coefficients $Y_{D-1}$, ..., $Y_0$. In embodiments, the division module 600 may receive the coefficients $X_D$, ..., $X_0$ as input, and may output the coefficients $Y_{D-1}$, ... $Y_0$ one-by-one. In embodiments, the coefficients $X_D$, ..., $X_0$ may correspond to the coefficients of f(x) described above, and the coefficients $Y_{D-1}$, ..., $Y_0$ may correspond to the coefficients of g(x) described above.

In embodiments, the division module 600 may perform the calculations sequentially from the highest-order coefficient $Y_{D-1}$ to the lowest-order coefficient $Y_1$. For example, to calculate the coefficient $Y_{D-1}$, the division module 600 may receive the coefficient $X_D$, and multiply the coefficient $X_D$ by $$\frac{1}{\alpha^j},$$

a which may be equivalent to dividing the coefficient $X_D$ by $\alpha^j$. In embodiments, the term $\alpha^j$ included in the monomial may be referred to as a monomial coefficient or a monomial term, and the term $$\frac{1}{\alpha^j}$$

may be referred to as an inverse of the monomial coefficient or an inverse of the monomial term. To calculate the coefficient $Y_{D-2}$, the division module 600 may receive the coefficient $X_{D-1}$, add the coefficient $X_{D-1}$ to the coefficient $Y_{D-1}$, and multiply the result of the addition by $$\frac{1}{\alpha^j}.$$

The division module 600 may proceed sequentially in this manner to calculate any number of coefficients. In embodiments, the division module 600 may calculate the coefficient $Y_{D-1}$ in a first operational cycle, and may calculate the coefficient $Y_{D-2}$ in a second operational cycle.

In embodiments, the division module 600 may perform the calculations sequentially from the lowest-order coefficient $Y_1$ to the highest-order coefficient $Y_D$. For example, to calculate the coefficient $Y_1$, the division module 600 may receive the coefficient $X_0=1$, multiply the coefficient $X_0$ by $\alpha^j$, and add a result of the multiplication to the coefficient $X_1$. Then, to calculate the coefficient $Y_2$, the division module 600 may multiply the coefficient $Y_1$ by $\alpha^j$, and add a result of the multiplication to the coefficient $X_2$. The division module 600 may proceed sequentially in this manner to calculate any number of coefficients. In embodiments, the division module 600 may calculate the coefficient $Y_1$ in a first operational cycle, and may calculate the coefficient $Y_2$ in a second operational cycle.

In embodiments, in order accelerate the calculations, the division module 600 may calculate coefficients in both directions simultaneously. For example, in embodiments, the division module 600 may calculate the coefficient $Y_{D-1}$ simultaneously with the $Y_1$, may calculate the coefficient $Y_{D-2}$ simultaneously with the $Y_2$, and so on until all of the coefficients $Y_{D-1}$, ..., $Y_0$ are calculated. In embodiments, coefficients being calculated simultaneously may mean that operations included in the calculations may be performed at a same time. In embodiments, coefficients being calculated simultaneously may mean that results of the calculations are obtained during a same operational cycle. For example, in embodiments the division module 600 may calculate the coefficient $Y_{D-1}$ and the coefficient $Y_1$ during the first operational cycle, may calculate the coefficient $Y_{D-2}$ and the coefficient $Y_2$ during the second operational cycle, and so on.

In embodiments, the division module 600 may calculate more than two coefficients per operational cycle. For example, assuming i calculations in a row per cycle, and starting from both sides, the expected latency may be D/2i cycles, which may mean that all of the coefficients may be calculated in D/2i cycles. For example, in embodiments, it may be possible to calculate, for example, two coefficients per side per cycle is feasible for GF(2^7), and possibly even three coefficients per side per cycle.

Figure 7:
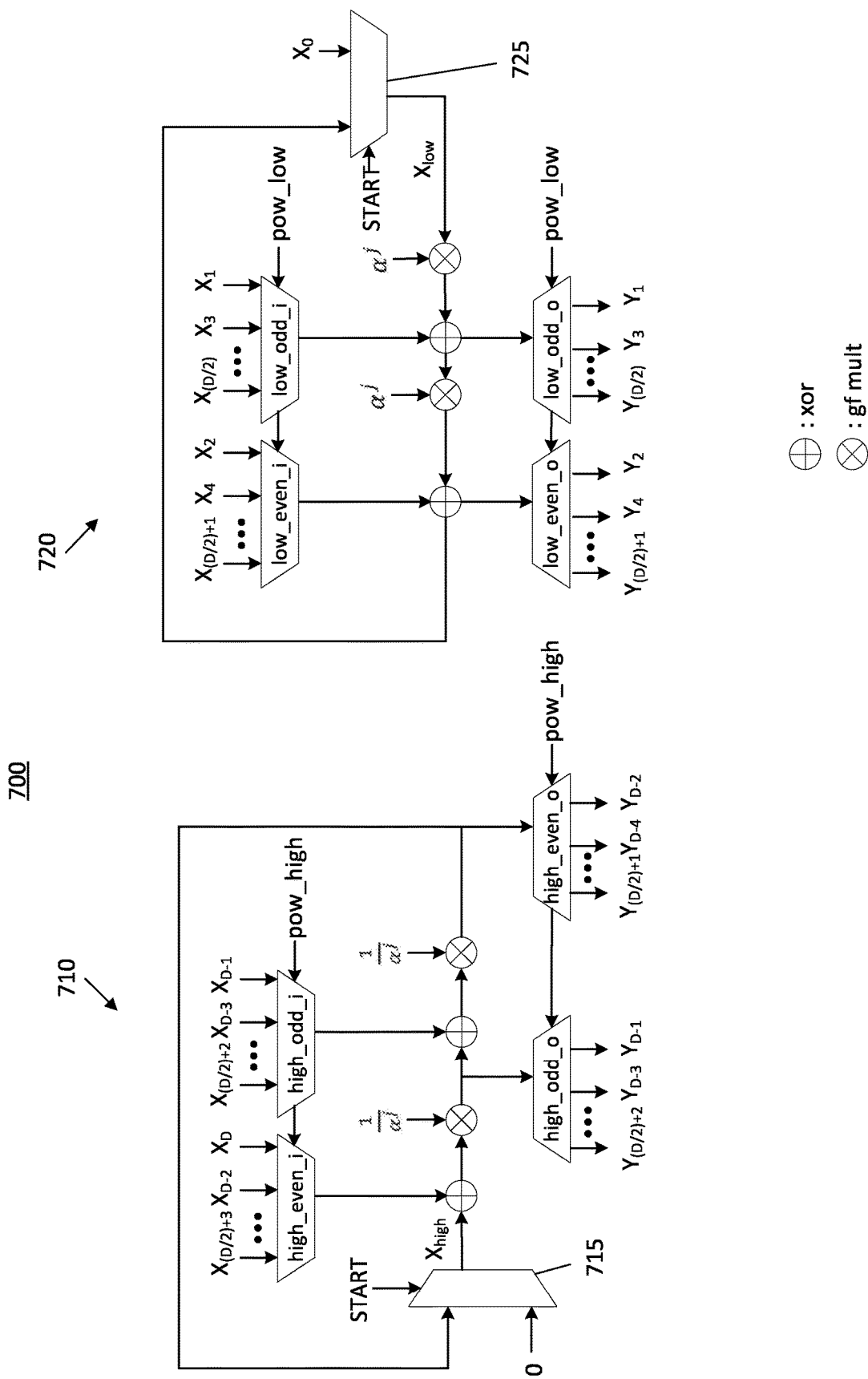
FIG. 7 is a block diagram of a division module, according to embodiments.

FIG. 7 is a block diagram illustrating an example hardware implementation of the division module described above, according to embodiments. As shown in FIG. 7, a division module 700 may include a high computation module 710, which may calculate from the highest-order coefficient down, and a low computation module 720, which may calculate from the lowest-order coefficient up. Each of the high computation module 710 and the low computation module 720 may include separate hardware for calculating even coefficients and odd coefficients, and therefore each of the high computation module 710 and the low computation module 720 may calculate two coefficients per operational cycle. Accordingly, in embodiments the division module 700 may calculate four coefficients per operational cycle. As a result, the division module 700 may have a latency of D/4 operational cycles.

As shown in FIG. 7, the high computation module 710 may include a multiplexer high_even_i, which may receive the coefficients $X_D$, $X_{D-2}$, ..., $X_{(D/2)+3}$, and a multiplexer high_odd_i, which may receive the coefficients $X_{D-1}$, $X_{D-3}$, ..., $X_{(D/2)+2}$. In addition, the high computation module 710 may include a multiplexer high_odd_o, which may output the coefficients $Y_{D-1}$, $Y_{D-3}$, ..., $Y_{(D/2)+2}$, and a multiplexer high_even_o, which may receive the coefficients $Y_{D-1}$, $X_{D-3}$, ..., $Y_{(D/2)+2}$. The high computation module 710 may also include a high input multiplexer 715, which may receive a value of 0 and an output of the high computation module 710. The multiplexers high_even_i, high_odd_i, high_even_o, and high_odd_o may be controlled by a signal pow high, and the high input multiplexer 715 may be controlled by a signal START. For example, in embodiments the multiplexers high_even_o, and high_odd_o may be controlled by the signal pow high to output a single coefficient at a time.

As further shown in FIG. 7, the low computation module 720 may include a multiplexer low_even_i, which may receive the coefficients $X_2$, $X_4$, ..., $X_{(D/2)+1}$, and a multiplexer low_odd_i, which may receive the coefficients $X_1$, $X_3$, ..., $X_{(D/2)}$. In addition, the low computation module 720 may include a multiplexer low_odd_o, which may output the coefficients $Y_{D-1}$, $Y_{D-3}$, ..., $Y_{(D/2)+2}$, and a multiplexer high_even_o, which may receive the coefficients $Y_1$, $X_3$, ..., $Y_{(D/2)}$. The low computation module 720 may also include a low input multiplexer 725, which may receive the coefficient $X_0$ and an output of the low computation module 720. The multiplexers low_even_i, low_odd_i, low_even_o, and low_odd_o may be controlled by a signal pow_low, and the low input multiplexer 725 may be controlled by a signal START. For example, in embodiments the multiplexers low_even_o, and low_odd_o may be controlled by the signal pow_low to output a single coefficient at a time.

In embodiments, during a first operational cycle, the start signal may cause the high input multiplexer 715 to output a value of 0 as the signal $X_{high}$. The signal pow high may cause the multiplexer high_even_i to output the coefficient $X_D$, and the multiplexer high_odd_i to output coefficient $X_{D-1}$. A bitwise XOR operation may be performed on the value of 0 and the coefficient $X_D$, and the result of this operation may be multiplied by the term $$\frac{1}{\alpha^j}.$$

The result of this multiplication may be provided to the multiplexer high_odd_o, and the value of the signal pow high may cause the multiplexer high_odd_o to output this result as the coefficient $Y_{D-1}$. A bitwise XOR operation may be performed on this value and the coefficient $X_{D-1}$, and the result of this operation may be multiplied by the term $$\frac{1}{\alpha^j}.$$

The result of this multiplication may be provided to the high input multiplexer 715 to be used as input for the next operational cycle, and may also be provided to the multiplexer high_even_o, which may be caused by the value of the signal pow high to output this result as the coefficient $Y_{D-2}$.

During the first operational cycle, the start signal may cause the low input multiplexer 725 to output a value of the coefficient $X_0$ as the signal $X_{low}$. The signal pow_low may cause the multiplexer low_odd_i to output the coefficient $X_1$, and the multiplexer low_even_i to output coefficient $X_2$. The value of the coefficient $X_0$ may be multiplied by the term $\alpha^j$, and a bitwise XOR operation may be performed on the result of this multiplication and the coefficient $X_1$. The result of this operation may be provided to the multiplexer low_odd_o, and the value of the signal pow_low may cause the multiplexer low_odd_o to output this result as the coefficient $Y_1$. This value may also be multiplied by the term $\alpha^j$, and a bitwise XOR operation may be performed on the result of this multiplication and the coefficient $X_2$. The result of this operation may be provided to the low input multiplexer 725 to be used as input for the next operational cycle, and may also be provided to the multiplexer low_even_o, which may be caused by the value of the signal pow_low to output this result as the coefficient $Y_2$.

Accordingly, the division module 700 may simultaneously perform operations for calculating the values of the coefficient $Y_1$ and the coefficient $Y_{D-1}$, and may simultaneously perform operations for calculating the values of the coefficient $Y_2$ and the coefficient $Y_{D-2}$. Therefore, the division module 700 may calculate the values of the coefficient $Y_1$, the coefficient $Y_2$, the coefficient $Y_D$, and the coefficient $Y_{D-1}$ during the same operational cycle.

During the second operational cycle, the start signal may cause the high input multiplexer 715 to output the value of the coefficient $Y_{D-2}$ obtained during the first operational cycle as the signal $X_{high}$. The signal pow high may cause the multiplexer high_even_i to output the coefficient $X_{D-2}$, and the multiplexer high_odd_i to output coefficient $X_{D-3}$. A bitwise XOR operation may be performed on the value of the signal $X_{high}$ and the coefficient $X_{D-2}$, and the result of this operation may be multiplied by the term $$\frac{1}{\alpha^j}.$$

The result of this multiplication may be provided to the multiplexer high_odd_o, and the value of the signal pow high may cause the multiplexer high_odd_o to output this result as the coefficient $Y_{D-3}$. A bitwise XOR operation may be performed on this value and the coefficient $X_{D-3}$, and the result of this operation may be multiplied by the term $$\frac{1}{\alpha^j}.$$

The result of this multiplication may be provided to the high input multiplexer 715 to be used as input for the next operational cycle, and may also be provided to the multiplexer high_even_o, which may be caused by the value of the signal pow high to output this result as the coefficient $Y_{D-4}$.

During the second operational cycle, the start signal may cause the low input multiplexer 725 to output the value of the coefficient $Y_2$ obtained during the first operational cycle as the signal $X_{low}$. The signal pow_low may cause the multiplexer low_odd_i to output the coefficient $X_3$, and the multiplexer low_even_i to output coefficient $X_4$. The value of the coefficient $Y_2$ may be multiplied by the term $\alpha^j$, and a bitwise XOR operation may be performed on the result of this multiplication and the coefficient $X_3$. The result of this operation may be provided to the multiplexer low_odd_o, and the value of the signal pow_low may cause the multiplexer low_odd_o to output this result as the coefficient $Y_3$. This value may also be multiplied by the term $\alpha_j$, and a bitwise XOR operation may be performed on the result of this multiplication and the coefficient $X_4$. The result of this operation may be provided to the low input multiplexer 725 to be used as input for the next operational cycle, and may also be provided to the multiplexer low_even_o, which may be caused by the value of the signal pow_low to output this result as the coefficient $Y_4$.

Accordingly, the division module 700 may simultaneously perform operations for calculating the values of the coefficient $Y_3$ and the coefficient $Y_{D-3}$, and may simultaneously perform operations for calculating the values of the coefficient $Y_4$ and the coefficient $Y_{D-4}$. Therefore, the division module 700 may calculate the values of the coefficient $Y_3$, the coefficient $Y_4$, the coefficient $Y_{D-2}$, and the coefficient $Y_{D-3}$ during the same operational cycle.

In embodiments, one or more coefficients, for example the coefficient $Y_{(D/2)+1}$, may be calculated by both the high computation module 710 and the low computation module 720. If the result from both sides is not equal, this may indicate that a multiplication or division error has occurred. In embodiments, care should be taken when selecting this middle to ensure that the high computation module 710 and the low computation module 720 do not inadvertently receive coefficients as inputs which are already updated as outputs.

In embodiments, indications of corrected frames may be received cycle-by-cycle. As an example, if a polynomial of degree 74 is processed using the division module 700, this may result in a latency of 74/4 operational cycles. In embodiments, this latency may be reduced by operating multiple instances of the division module 600 or the division module 700 in parallel.

Figure 8:
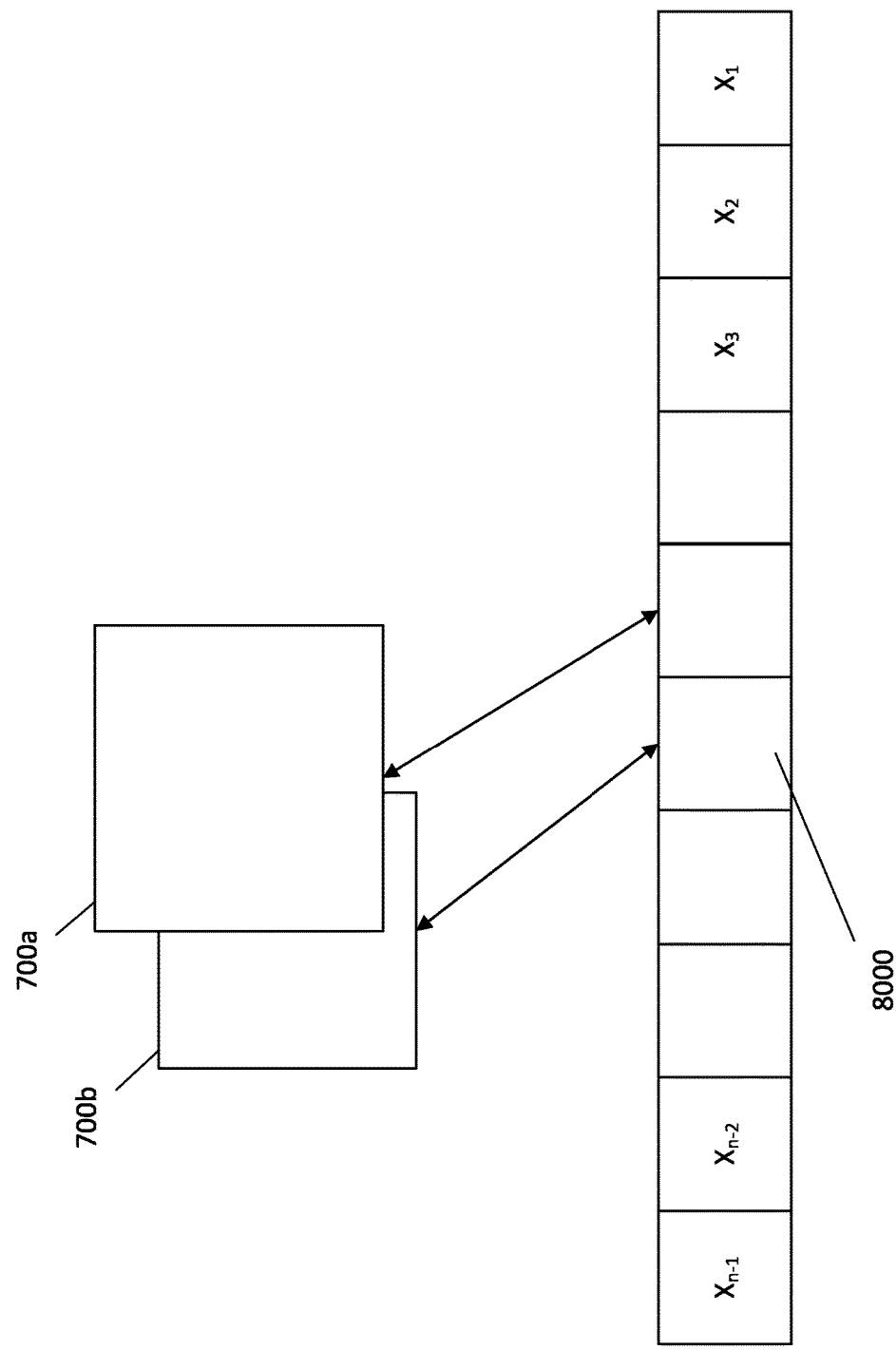
FIG. 8 is a block diagram of block diagram of two division modules operating in parallel, according to embodiments.

FIG. 8 is a block diagram of two division modules operating in a parallel pipelined architecture. In embodiments, each of the two division modules may operate on a different coefficient simultaneously. For example, if an indication is received that a frame is corrected in a first operational cycle, then a first division module 700a begin operating on an ELP 8000. Then, if a new indication is received that a different frame is corrected in a second operational cycle, then a second division module 700b may being operating on the ELP 8000. This may be possible because the highest and lowest order coefficients of the ELP 8000 are stable after at least one operational cycle. In other words, after the first operational cycle, subsequent operations of the first division module 700a do not alter the highest-order coefficient and the lowest-order coefficient. Therefore, beginning in the second operational cycle, the second division module 700b may perform calculations using the highest-order coefficient and the lowest-order coefficient, and the first division module 700a and the second division module 700b may proceed in parallel. In embodiments, all of the division modules operating in parallel may start with the same degree, using zeros for higher coefficients, in order to avoid coefficient overruns.

Figure 9:
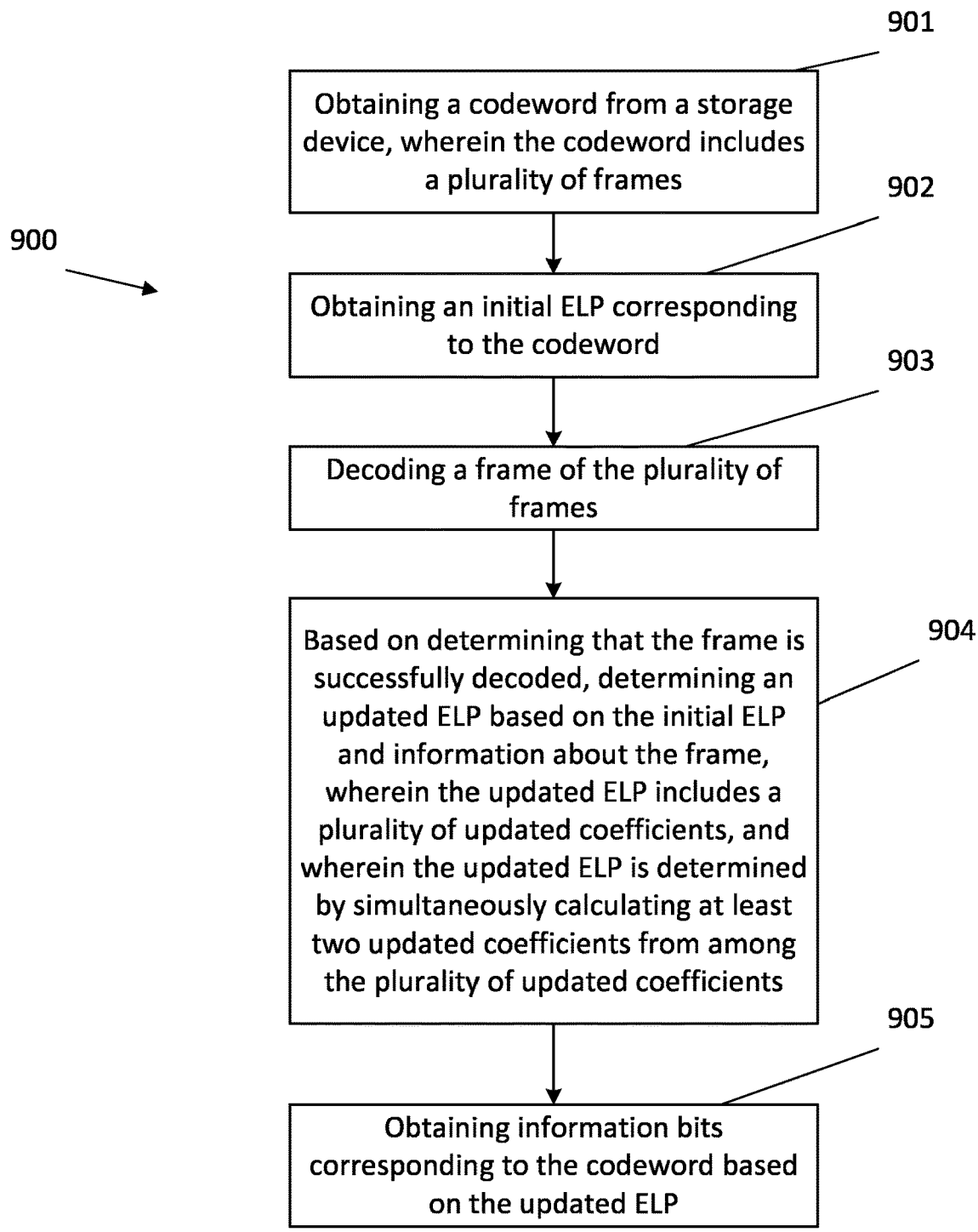
FIG. 9 is a flowchart of a process of controlling a storage system, according to embodiments.

FIG. 9 is a flowchart of a process 900 of controlling a storage device, according to embodiments. In some implementations, one or more process blocks of FIG. 9 may be performed by the division module 600, the division module 700, or any other element described above with reference to FIGS. 1-8.

As shown in FIG. 9, at operation 901 the process 900 may include. In embodiments, obtaining a codeword from a storage device. In embodiments, the codeword may be an SPolar GCC codeword, and may include a plurality of frames.

As further shown in FIG. 9, at operation 902 the process 900 may include obtaining an initial ELP corresponding to the codeword.

As further shown in FIG. 9, at operation 903 the process 900 may include decoding a frame of the plurality of frames. In embodiments, the frame may be decoded using RS decoding.

As further shown in FIG. 9, at operation 904 the process 900 may include, based on determining that the frame is successfully decoded, determining an updated ELP based on the initial ELP and information about the frame. In embodiments, the updated ELP may include a plurality of updated coefficients, and the updated ELP may be determined by simultaneously calculating at least two updated coefficients from among the plurality of updated coefficients. In embodiments, the updated ELP may have a lower degree than the initial ELP. In embodiments, the roots of the ELP may indicate error locations.

As further shown in FIG. 9, at operation 905 the process 900 may include obtaining information bits corresponding to the codeword based on the updated ELP.

In embodiments, the information about the frame may include a monomial term or monomial coefficient corresponding to the frame. In embodiments, the monomial term may correspond to $\alpha^j$.

In embodiments, the plurality of updated coefficients may correspond to a plurality of remaining frames from among the plurality of frames, the plurality of updated coefficients may include a highest updated coefficient corresponding to a highest order remaining frame from among the plurality of remaining frames, and a lowest updated coefficient corresponding to a lowest order remaining frame from among the plurality of remaining frames, and the updated ELP may be determined by calculating the highest updated coefficient simultaneously with the lowest updated coefficient.

In embodiments, the initial ELP may include a plurality of coefficients corresponding to the plurality of frames, the plurality of coefficients may include a highest coefficient and a lowest coefficient, the highest updated coefficient may be calculated based on the highest coefficient, and the lowest updated coefficient may be calculated based on the lowest coefficient.

In embodiments, the highest updated coefficient may be calculated by multiplying the highest coefficient by an inverse of the monomial term, and the lowest updated coefficient may be calculated by performing a bitwise XOR operation on the lowest coefficient and the monomial term.

In embodiments, the plurality of coefficients may include a second highest coefficient and a second lowest coefficient, the plurality of updated coefficients may include a second highest updated coefficient corresponding to a second highest order remaining frame from among the plurality of remaining frames, and a second lowest updated coefficient corresponding to a second lowest order remaining frame from among the plurality of remaining frames, and the updated ELP may be determined by calculating the second highest updated coefficient simultaneously with the second lowest updated coefficient In embodiments, the second highest updated coefficient may be calculated by multiplying the inverse of the monomial term with a result of performing the bitwise XOR operation on the highest updated coefficient and the second highest coefficient, and the second lowest updated coefficient may be calculated by performing the bitwise XOR operation on the second lowest coefficient and a result of multiplying the lowest updated coefficient with the monomial term.

Although FIG. 9 shows example blocks of process 900, in some implementations, the process 900 may include additional blocks, fewer blocks, different blocks, or differently arranged blocks than those depicted in FIG. 9. Additionally, or alternatively, two or more of the blocks of the process 900 may be arranged or combined in any order, or performed in parallel.

Figure 10:
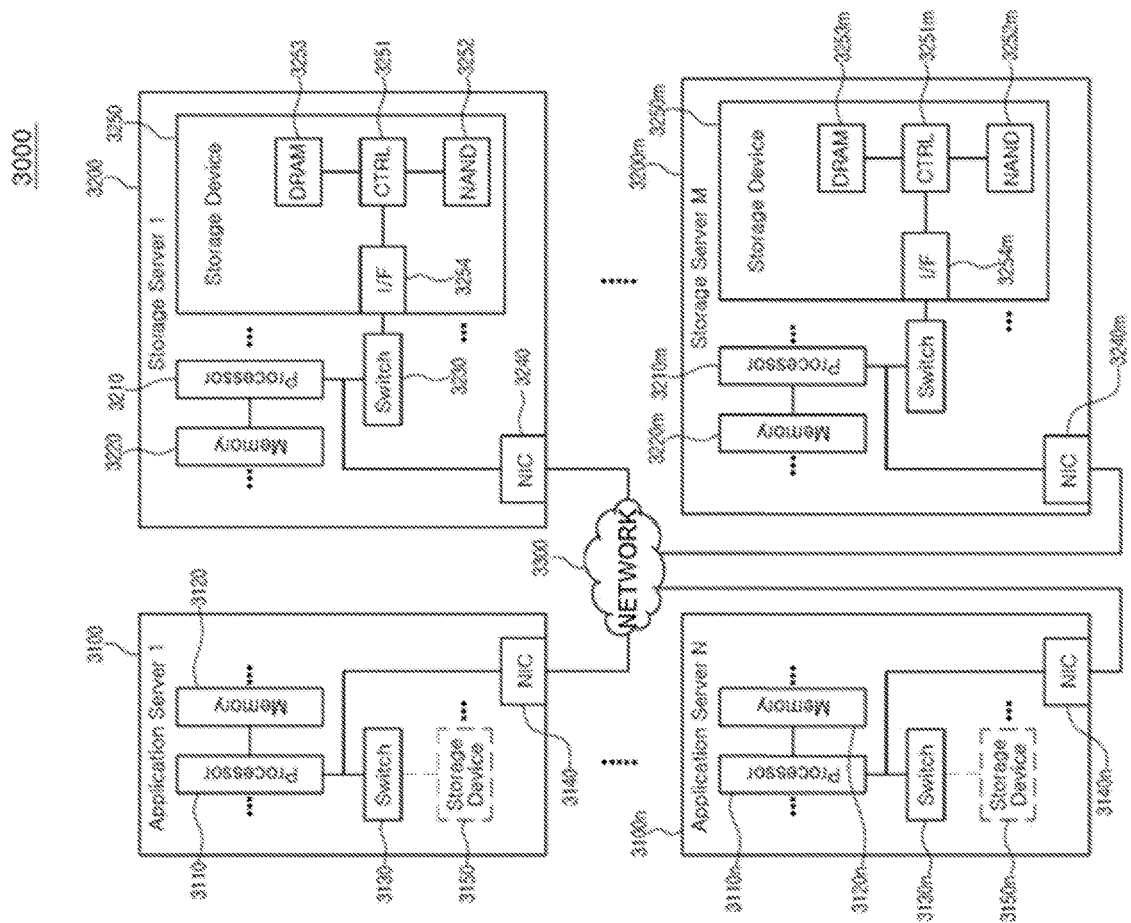
FIG. 10 is a block diagram of data center, according to embodiments.

FIG. 10 is a diagram of a data center 3000 to which a memory device is applied, according to embodiments.

Referring to FIG. 10, the data center 3000 may be a facility that collects various types of pieces of data and provides services and be referred to as a data storage center. The data center 3000 may be a system for operating a search engine and a database, and may be a computing system used by companies, such as banks, or government agencies. The data center 3000 may include application servers 3100 to 3100n and storage servers 3200 to 3200m. The number of application servers 3100 to 3100n and the number of storage servers 3200 to 3200m may be variously selected according to embodiments. The number of application servers 3100 to 3100n may be different from the number of storage servers 3200 to 3200m.

The application server 3100 or the storage server 3200 may include at least one of processors 3110 and 3210 and memories 3120 and 3220. The storage server 3200 will now be described as an example. The processor 3210 may control all operations of the storage server 3200, access the memory 3220, and execute instructions and/or data loaded in the memory 3220. The memory 3220 may be a double-data-rate synchronous DRAM (DDR SDRAM), a high-bandwidth memory (HBM), a hybrid memory cube (HMC), a dual in-line memory module (DIMM), Optane DIMM, and/or a non-volatile DIMM (NVMDIMM). In some embodiments, the numbers of processors 3210 and memories 3220 included in the storage server 3200 may be variously selected. In embodiments, the processor 3210 and the memory 3220 may provide a processor-memory pair. In embodiments, the number of processors 3210 may be different from the number of memories 3220. The processor 3210 may include a single-core processor or a multi-core processor. The above description of the storage server 3200 may be similarly applied to the application server 3100. In some embodiments, the application server 3100 may not include a storage device 3150. The storage server 3200 may include at least one storage device 3250. The number of storage devices 3250 included in the storage server 3200 may be variously selected according to embodiments.

The application servers 3100 to 3100n may communicate with the storage servers 3200 to 3200m through a network 3300. The network 3300 may be implemented by using a fiber channel (FC) or Ethernet. In this case, the FC may be a medium used for relatively high-speed data transmission and use an optical switch with high performance and high availability. The storage servers 3200 to 3200m may be provided as file storages, block storages, or object storages according to an access method of the network 3300.

In embodiments, the network 3300 may be a storage-dedicated network, such as a storage area network (SAN). For example, the SAN may be an FC-SAN, which uses an FC network and is implemented according to an FC protocol (FCP). As another example, the SAN may be an Internet protocol (IP)-SAN, which uses a transmission control protocol (TCP)/IP network and is implemented according to a SCSI over TCP/IP or Internet SCSI (iSCSI) protocol. In another embodiment, the network 3300 may be a general network, such as a TCP/IP network. For example, the network 3300 may be implemented according to a protocol, such as FC over Ethernet (FCoE), network attached storage (NAS), and NVMe over Fabrics (NVMe-oF).

Hereinafter, the application server 3100 and the storage server 3200 will mainly be described. A description of the application server 3100 may be applied to another application server 3100n, and a description of the storage server 3200 may be applied to another storage server 3200m.

The application server 3100 may store data, which is requested by a user or a client to be stored, in one of the storage servers 3200 to 3200m through the network 3300. Also, the application server 3100 may obtain data, which is requested by the user or the client to be read, from one of the storage servers 3200 to 3200m through the network 3300. For example, the application server 3100 may be implemented as a web server or a database management system (DBMS).

The application server 3100 may access a memory 3120n or a storage device 3150n, which is included in another application server 3100n, through the network 3300. Alternatively, the application server 3100 may access memories 3220 to 3220m or storage devices 3250 to 3250m, which are included in the storage servers 3200 to 3200m, through the network 3300. Thus, the application server 3100 may perform various operations on data stored in application servers 3100 to 3100n and/or the storage servers 3200 to 3200m. For example, the application server 3100 may execute an instruction for moving or copying data between the application servers 3100 to 3100n and/or the storage servers 3200 to 3200m. In this case, the data may be moved from the storage devices 3250 to 3250m of the storage servers 3200 to 3200m to the memories 3120 to 3120n of the application servers 3100 to 3100n directly or through the memories 3220 to 3220m of the storage servers 3200 to 3200m. The data moved through the network 3300 may be data encrypted for security or privacy.

The storage server 3200 will now be described as an example. An interface 3254 may provide physical connection between a processor 3210 and a controller 3251 and a physical connection between a network interface card (NIC) 3240 and the controller 3251. For example, the interface 3254 may be implemented using a direct attached storage (DAS) scheme in which the storage device 3250 is directly connected with a dedicated cable. For example, the interface 3254 may be implemented by using various interface schemes, such as ATA, SATA, e-SATA, an SCSI, SAS, PCI, PCIe, NVMe, IEEE 1394, a USB interface, an SD card interface, an MMC interface, an eMMC interface, a UFS interface, an eUFS interface, and/or a CF card interface.

The storage server 3200 may further include a switch 3230 and the NIC(Network InterConnect) 3240. The switch 3230 may selectively connect the processor 3210 to the storage device 3250 or selectively connect the NIC 3240 to the storage device 3250 via the control of the processor 3210.

In embodiments, the NIC 3240 may include a network interface card and a network adaptor. The NIC 3240 may be connected to the network 3300 by a wired interface, a wireless interface, a Bluetooth interface, or an optical interface. The NIC 3240 may include an internal memory, a digital signal processor (DSP), and a host bus interface and be connected to the processor 3210 and/or the switch 3230 through the host bus interface. The host bus interface may be implemented as one of the above-described examples of the interface 3254. In embodiments, the NIC 3240 may be integrated with at least one of the processor 3210, the switch 3230, and the storage device 3250.

In the storage servers 3200 to 3200$m$ or the application servers 3100 to 3100$n$, a processor may transmit a command to storage devices 3150 to 3150$n$ and 3250 to 3250$m$ or the memories 3120 to 3120$n$ and 3220 to 3220$m$ and program or read data. In this case, the data may be data of which an error is corrected by an ECC engine. The data may be data on which a data bus inversion (DBI) operation or a data masking (DM) operation is performed, and may include cyclic redundancy code (CRC) information. The data may be data encrypted for security or privacy.

Storage devices 3150 to 3150$n$ and 3250 to 3250$m$ may transmit a control signal and a command/address signal to NAND flash memory devices 3252 to 3252$m$ in response to a read command received from the processor. Thus, when data is read from the NAND flash memory devices 3252 to 3252$m$, a read enable (RE) signal may be input as a data output control signal, and thus, the data may be output to a DQ bus. A data strobe signal DQS may be generated using the RE signal. The command and the address signal may be latched in a page buffer depending on a rising edge or falling edge of a write enable (WE) signal.

The controller 3251 may control all operations of the storage device 3250. In embodiments, the controller 3251 may include SRAM. The controller 3251 may write data to the NAND flash memory device 3252 in response to a write command or read data from the NAND flash memory device 3252 in response to a read command. For example, the write command and/or the read command may be provided from the processor 3210 of the storage server 3200, the processor 3210$m$ of another storage server 3200$m$, or the processors 3110 and 3110$n$ of the application servers 3100 and 3100$n$. DRAM 3253 may temporarily store (or buffer) data to be written to the NAND flash memory device 3252 or data read from the NAND flash memory device 3252. Also, the DRAM 3253 may store metadata. Here, the metadata may be user data or data generated by the controller 3251 to manage the NAND flash memory device 3252. The storage device 3250 may include a secure element (SE) for security or privacy.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

The various operations of methods described above may be performed by any suitable means capable of performing the operations, such as various hardware and/or software component(s), circuits, and/or module(s).

The software may include an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing is illustrative of the embodiments and is not to be construed as limiting thereof. Although a few embodiments have been described, those skilled in the art will readily appreciate that many modifications are possible in the embodiments without materially departing from the present scope.

What is claimed is:

1. A storage system comprising:
   a storage device configured to store a plurality of codewords; and
   at least one processor configured to:
      obtain a codeword from among the plurality of codewords from the storage device, wherein the codeword comprises a plurality of frames;
      obtain an initial error locator polynomial (ELP) corresponding to the codeword;
      decode a frame of the plurality of frames;
      based on the frame being successfully decoded, determine an updated ELP based on the initial ELP and information about the frame; and
      obtain information bits corresponding to the codeword based on the updated ELP,
   wherein the updated ELP comprises a plurality of updated coefficients, and
   wherein the at least one processor is further configured to determine the updated ELP by simultaneously calculating at least two updated coefficients from among the plurality of updated coefficients.

2. The storage system of claim 1, wherein the information about the frame comprises a monomial term which is included in a monomial corresponding to the frame.

3. The storage system of claim 2, wherein the plurality of updated coefficients correspond to a plurality of remaining frames from among the plurality of frames, wherein the plurality of updated coefficients comprises a highest updated coefficient corresponding to a highest order remaining frame from among the plurality of remaining frames, and a lowest updated coefficient corresponding to a lowest order remaining frame from among the plurality of remaining frames, and wherein the at least one processor is further configured to determine the updated ELP by calculating the highest updated coefficient simultaneously with the lowest updated coefficient.

4. The storage system of claim 3, wherein the initial ELP comprises a plurality of coefficients corresponding to the plurality of frames, wherein the plurality of coefficients comprises a highest coefficient and a lowest coefficient, and wherein the at least one processor is further configured to calculate the highest updated coefficient based on the highest coefficient, and to calculate the lowest updated coefficient based on the lowest coefficient.

5. The storage system of claim 4, wherein the at least one processor is further configured to calculate the highest updated coefficient by multiplying the highest coefficient by an inverse of the monomial term, and to calculate the lowest updated coefficient by performing a bitwise XOR operation on the lowest coefficient and the monomial term.

6. The storage system of claim 5, wherein the plurality of coefficients further comprises a second highest coefficient and a second lowest coefficient, wherein the plurality of updated coefficients further comprises a second highest updated coefficient corresponding to a second highest order remaining frame from among the plurality of remaining frames, and a second lowest updated coefficient corresponding to a second lowest order remaining frame from among the plurality of remaining frames, and wherein the at least one processor is further configured to determine the updated ELP by calculating the second highest updated coefficient simultaneously with the second lowest updated coefficient.

7. The storage system of claim 6, wherein the at least one processor is further configured to:

calculate the second highest updated coefficient by multiplying the inverse of the monomial term with a result of performing the bitwise XOR operation on the highest updated coefficient and the second highest coefficient, and calculate the second lowest updated coefficient by performing the bitwise XOR operation on the second lowest coefficient and a result of multiplying the lowest updated coefficient with the monomial term.

8. The storage system of claim 1, wherein the codeword comprises a generalized concatenated code (GCC) codeword, and wherein the updated ELP is used to perform Reed Solomon decoding corresponding to the GCC codeword.

9. A device for decoding a codeword which comprises a plurality of frames, the device comprising:

at least one processor configured to:
obtain an initial error locator polynomial (ELP) corresponding to the codeword;
decode a frame of the plurality of frames;
based on the frame being successfully decoded, determine an updated ELP by simultaneously calculating at least two updated coefficients from among a plurality of updated coefficients included in the updated ELP; and obtain information bits corresponding to the codeword based on the updated ELP.

10. The device of claim 9, wherein the updated ELP is determined based on the initial ELP and a monomial term which is included in a monomial corresponding to the frame.

11. The device of claim 10, wherein the plurality of updated coefficients correspond to a plurality of remaining frames from among the plurality of frames, wherein the plurality of updated coefficients comprises a highest updated coefficient corresponding to a highest order remaining frame from among the plurality of remaining frames, and a lowest updated coefficient corresponding to a lowest order remaining frame from among the plurality of remaining frames, and wherein the at least one processor is further configured to determine the updated ELP by calculating the highest updated coefficient simultaneously with the lowest updated coefficient.

12. The device of claim 11, wherein the initial ELP comprises a plurality of coefficients corresponding to the plurality of frames, wherein the plurality of coefficients comprises a highest coefficient and a lowest coefficient corresponding to a lowest order frame from among the plurality of frames, and wherein the at least one processor is further configured to calculate the highest updated coefficient based on the highest coefficient, and to calculate the lowest updated coefficient based on the lowest coefficient.

13. The device of claim 12, wherein the at least one processor is further configured to calculate the highest updated coefficient by multiplying the highest coefficient by an inverse of the monomial term, and to calculate the lowest updated coefficient by performing a bitwise XOR operation on the lowest coefficient and the monomial term.

14. The device of claim 13, wherein the plurality of coefficients further comprises a second highest coefficient and a second lowest coefficient, wherein the plurality of updated coefficients further comprises a second highest updated coefficient corresponding to a second highest order remaining frame from among the plurality of remaining frames, and a second lowest updated coefficient corresponding to a second lowest order remaining frame from among the plurality of remaining frames, and wherein the at least one processor is further configured to determine the updated ELP by calculating the second highest updated coefficient simultaneously with the second lowest updated coefficient.

15. The device of claim 14, wherein the at least one processor is further configured to:

calculate the second highest updated coefficient by multiplying the inverse of the monomial term with a result of performing the bitwise XOR operation on the highest updated coefficient and the second highest coefficient, and calculate the second lowest updated coefficient by performing the bitwise XOR operation on the second lowest coefficient and a result of multiplying the lowest updated coefficient with the monomial term.

16. The device of claim 9, wherein the codeword comprises a generalized concatenated code (GCC) codeword, and wherein the updated ELP is used to perform Reed Solomon decoding corresponding to the GCC codeword.

17. A method of controlling a storage system, the method being executed by at least one processor and comprising:
- obtaining a codeword from a storage device, wherein the codeword comprises a plurality of frames;
- obtaining an initial error locator polynomial (ELP) corresponding to the codeword;
- decoding a frame of the plurality of frames;
- based on the frame being successfully decoded, determining an updated ELP based on the initial ELP and information about the frame; and
- obtaining information bits corresponding to the codeword based on the updated ELP,
- wherein the updated ELP comprises a plurality of updated coefficients, and
- wherein the determining the updated ELP comprises simultaneously calculating at least two updated coefficients from among the plurality of updated coefficients.

18. The method of claim 17, wherein the information about the frame comprises a monomial term which is included in a monomial corresponding to the frame.

19. The method of claim 18, wherein the plurality of updated coefficients correspond to a plurality of remaining frames from among the plurality of frames,
- wherein the plurality of updated coefficients comprises a highest updated coefficient corresponding to a highest order remaining frame from among the plurality of remaining frames, and a lowest updated coefficient corresponding to a lowest order remaining frame from among the plurality of remaining frames, and
- wherein the simultaneously calculating the at least two updated coefficients comprises calculating the highest updated coefficient simultaneously with the lowest updated coefficient.

20. The method of claim 19, wherein the initial ELP comprises a plurality of coefficients corresponding to the plurality of frames,
- wherein the plurality of coefficients comprises a highest coefficient and a lowest coefficient, and
- wherein the highest updated coefficient is calculated based on the highest coefficient, and
- wherein the lowest updated coefficient is calculated based on the lowest coefficient.

* * * * *